United States Patent
Hadipour Abkenar et al.

(10) Patent No.: US 11,651,887 B2
(45) Date of Patent: May 16, 2023

(54) STACKED AND INTERLEAVED TRANSFORMER LAYOUT

(71) Applicant: Infineon Technologies AG, Neubiberg (DE)

(72) Inventors: Kambiz Hadipour Abkenar, Linz (AT); Martin Dechant, Graz (AT)

(73) Assignee: Infineon Technologies AG, Neubiberg (DE)

( * ) Notice: Subject to any disclaimer, the term of this patent is extended or adjusted under 35 U.S.C. 154(b) by 359 days.

(21) Appl. No.: 16/884,993

(22) Filed: May 27, 2020

(65) Prior Publication Data

US 2021/0375522 A1    Dec. 2, 2021

(51) Int. Cl.
*H01F 27/28*   (2006.01)
*H01F 41/04*   (2006.01)
*H01F 27/40*   (2006.01)
*H01L 49/02*   (2006.01)

(52) U.S. Cl.
CPC .............. *H01F 27/28* (2013.01); *H01F 27/40* (2013.01); *H01F 41/04* (2013.01); *H01L 28/10* (2013.01)

(58) Field of Classification Search
CPC .......... H01F 27/28; H01F 27/40; H01F 41/04; H01F 19/04; H01F 27/2804; H01F 41/041; H01F 2027/2809; H01F 2027/2819; H01L 28/10; H01L 23/645; H01L 27/0203; H01L 27/0207; H01L 2223/64
See application file for complete search history.

(56) References Cited

U.S. PATENT DOCUMENTS

| | | |
|---|---|---|
| 2003/0001709 A1 | 1/2003 | Visser |
| 2008/0284552 A1 | 11/2008 | Lim et al. |
| 2009/0066457 A1 | 3/2009 | Uchida |
| 2009/0174515 A1* | 7/2009 | Lee ............... H01F 27/2804 336/182 |
| 2010/0117737 A1 | 5/2010 | Kondo et al. |
| 2010/0164667 A1 | 7/2010 | Ho-Hsiang |
| 2011/0043316 A1 | 2/2011 | Yang et al. |
| 2011/0316657 A1 | 12/2011 | Park et al. |
| 2012/0146741 A1 | 6/2012 | Yen et al. |
| 2012/0274434 A1 | 11/2012 | Lim et al. |
| 2014/0322435 A1 | 10/2014 | Lo et al. |
| 2016/0027571 A1* | 1/2016 | Zhang ............... H01F 19/04 336/173 |
| 2017/0287618 A1 | 10/2017 | Knopik |
| 2017/0345559 A1 | 11/2017 | Vanukuru |
| 2021/0217554 A1* | 7/2021 | Lin ............... H01F 17/0013 |

FOREIGN PATENT DOCUMENTS

CN    112992493 A  *  6/2021
EP    3316266 A1      5/2018

* cited by examiner

*Primary Examiner* — Stacy Whitmore
(74) *Attorney, Agent, or Firm* — Harrity & Harrity, LLP

(57) ABSTRACT

A transformer structure may include a first coil having one or more turns, and a second coil having one or more turns. A turn of the one or more turns of the first coil may overlap a turn of the one or more turns of the second coil in a lateral direction substantially along the turn of the first coil and in a vertical direction substantially along the turn of the first coil. In some implementations, the transformer structure may be integrated in a semiconductor device.

20 Claims, 23 Drawing Sheets

Illustration of half of a 1:2 power combiner ately 1 micron

STACKED AND INTERLEAVED TRANSFORMER LAYOUT

BACKGROUND

Transformers and transformer-based components, such as power splitters, combiners, and the like, can be used in millimeter (mm) wave integrated circuit design. One important parameter in design of a transformer structure is insertion loss of a coil (e.g., a primary coil, a secondary coil), which has a direct impact on an output power of a transmitter and/or a noise figure of a receiver. One type of transform structure is a stacked transformer structure. A stacked transformer structure relies on vertical (i.e., transverse) coupling between coils located primarily in different planes. Another type of transformer structure is an interleaved transformer structure. An interleaved transformer structure (also referred to as a planar transformer structure) relies on lateral (i.e., side) coupling between coils located primarily in the same plane.

SUMMARY

According to some possible implementations, a transformer structure may include a first coil having one or more turns; and a second coil having one or more turns, wherein a turn of the one or more turns of the first coil overlaps a turn of the one or more turns of the second coil in a lateral direction substantially along the turn of the first coil and in a vertical direction substantially along the turn of the first coil.

According to some possible implementations, a method may include forming a first coil having at least one turn; and forming a second coil having at least one turn, wherein a first portion of a turn of the first coil is formed to overlap a turn of the second coil in a first direction substantially along the first portion of the turn of the first coil, and wherein a second portion of the turn of the first coil is formed to overlap the turn of the second coil in a second direction substantially along the second portion of the turn of the first coil, wherein the second direction is perpendicular to the first direction.

According to some possible implementations, a semiconductor device may include a transformer structure including a first coil having one or more turns; and a second coil having one or more turns, wherein a turn of the one or more turns of the first coil overlaps a turn of the one or more turns of the second coil in a lateral direction and in a vertical direction substantially along the turn of the first coil.

DETAILED DESCRIPTION

Figure 1A:
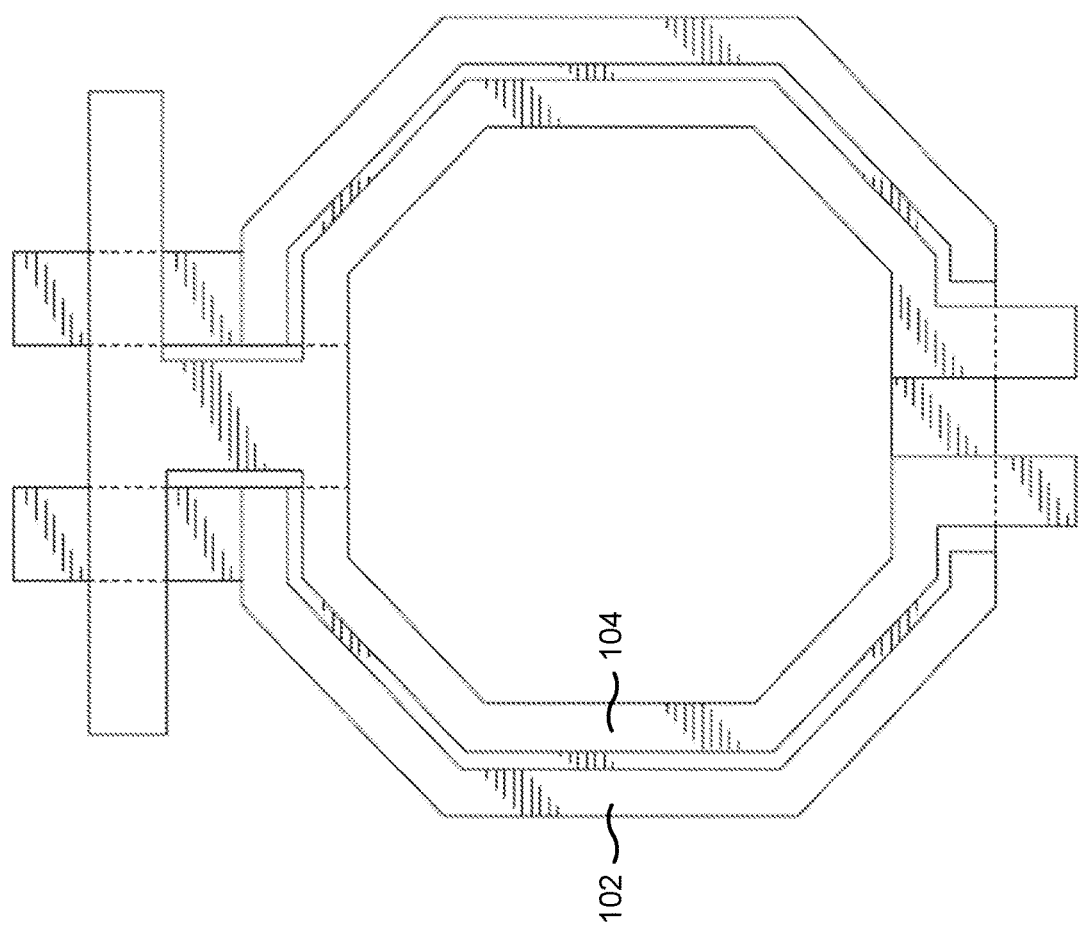
FIGS. 1A-1H are diagrams associated with a first example implementation of a transformer structure that includes a stacked and interleaved architecture, as described herein.

The following detailed description of example implementations refers to the accompanying drawings. The same reference numbers in different drawings may identify the same or similar elements.

One factor that determines an amount of insertion loss of a transformer structure is coupling between a primary coil of the transformer structure and a secondary coil of the transformer structure. As a frequency of operation in which a transformer structure is used increases (e.g., to mm-wave frequencies and higher), a size of the transformer structure becomes smaller, which makes achieving a high coupling coefficient, and therefore low insertion loss, more difficult. Prior techniques for reducing insertion loss in a transformer structure include using a stacked structure, or an interleaved structure (e.g., with at least a required minimum spacing between transformer turns). Other options may also be possible, such as the use of a specially designed layout (e.g., a quadrafilar combiner), or a design based on differently sized transformer structures.

Generally, a manufacturing technology that provides a metal stack with two thick metal layers (e.g., having thicknesses equal to or greater than approxim ($\mu$m)) is used for fabricating mm-wave integrated circuits. However, in some cases, a manufacturing technology may provide a metal stack having only a single thick metal layer. In such a case, a stacked structure is not feasible (e.g., since the stacked structure requires at least two thick metal layers to form the primary and secondary coils), and so an interleaved structure (e.g., in which the primary and secondary coils are formed on the single thick metal layer) is the typical candidate for realizing a transformer structure. A quality (Q) factor and electro-migration aspects benefit from the use of an interleaved structure. However, due to minimum spacing requirements (e.g., for an amount of space between turns of the coils), a transformer structure with an interleaved design cannot achieve low insertion loss for a certain primary and secondary inductance because the required spacing limits an achievable coupling between coils of the transformer structure.

Some implementations described herein provide a transformer structure having a stacked and interleaved design. In some implementations, a transformer structure with the stacked and interleaved design (herein referred to as stacked/interleaved transformer structure) may have a first coil and a second coil, where a turn of the first coil overlaps a turn of the second coil in both a lateral direction substantially along the turn of the first coil (e.g., to provide lateral coupling substantially along the turn of the first coil) and in a vertical direction substantially along the turn of the first coil (e.g., to provide vertical coupling substantially along the turn of the first coil).

In some implementations, the stacked/interleaved transformer structure reduces insertion loss and increases coupling coefficient between the primary coil and the secondary coil (e.g., as compared to a stacked structure alone, as compared to an interleaved structure alone). That is, by employing a combination of interleaved and stacked architectures, the stacked/interleaved transformer structure may gain advantages of both the stacked approach and the interleaved approach. Additionally, the stacked/interleaved transformer structure design described herein does not impact a size or a general structure of the primary or secondary coils, meaning that the stacked/interleaved transformer structure can be readily integrated into current integrated circuit designs. In some implementations, when used in a radar transceiver system, the stacked/interleaved transformer structure described herein may increase an output power of a transmitter and decrease a noise figure of a low noise amplifier, both of which impact a signal-to-noise ratio (SNR) of the radar transceiver system, meaning that the stacked/interleaved transformer structure can improve quality of a radar image.

In some implementations, the stacked/interleaved transformer structure includes an interleaved structure in which both the primary and secondary coils are formed on a thick metal layer. Further the stacked/interleaved transformer structure includes a stacked structure using an additional winding geometry, connected to either the primary coil or the secondary coil, that is formed on a thin (e.g., having a thickness that is less than approximately 1 μm) metal layer below the thick metal layer. Here, the combination of the stacked and interleaved architectures increases coupling between the primary and secondary coils.

Notably, the stacked/interleaved transformer structure may be particularly useful when a manufacturing technology provides a metal stack having a single thick metal layer. However, the stacked/interleaved transformer structure can be used in other scenarios, such as when a manufacturing technology provides a metal stack with two thick metal layers, and still provide the benefits described above. For example, when the manufacturing technology provides a metal stack with two thick metal layers, a coupling coefficient of the transformer structure can be increased by including a lateral winding in parallel to an upper turn to realize a stacked/interleaved transformer structure.

FIGS. 1A-1H are diagrams associated with a first example implementation of a transformer structure 100 that includes a stacked and interleaved architecture. In some implementations, the transformer structure 100 is integrated in a semiconductor device. In some implementations, the transformer structure 100 can be used for realization of coils in a combiner, a splitter, or the like, included in a power amplifier or another type of circuit (e.g., a low noise amplifier) in which low insertion loss and/or high magnetic coupling is desired.

Figure 1B:
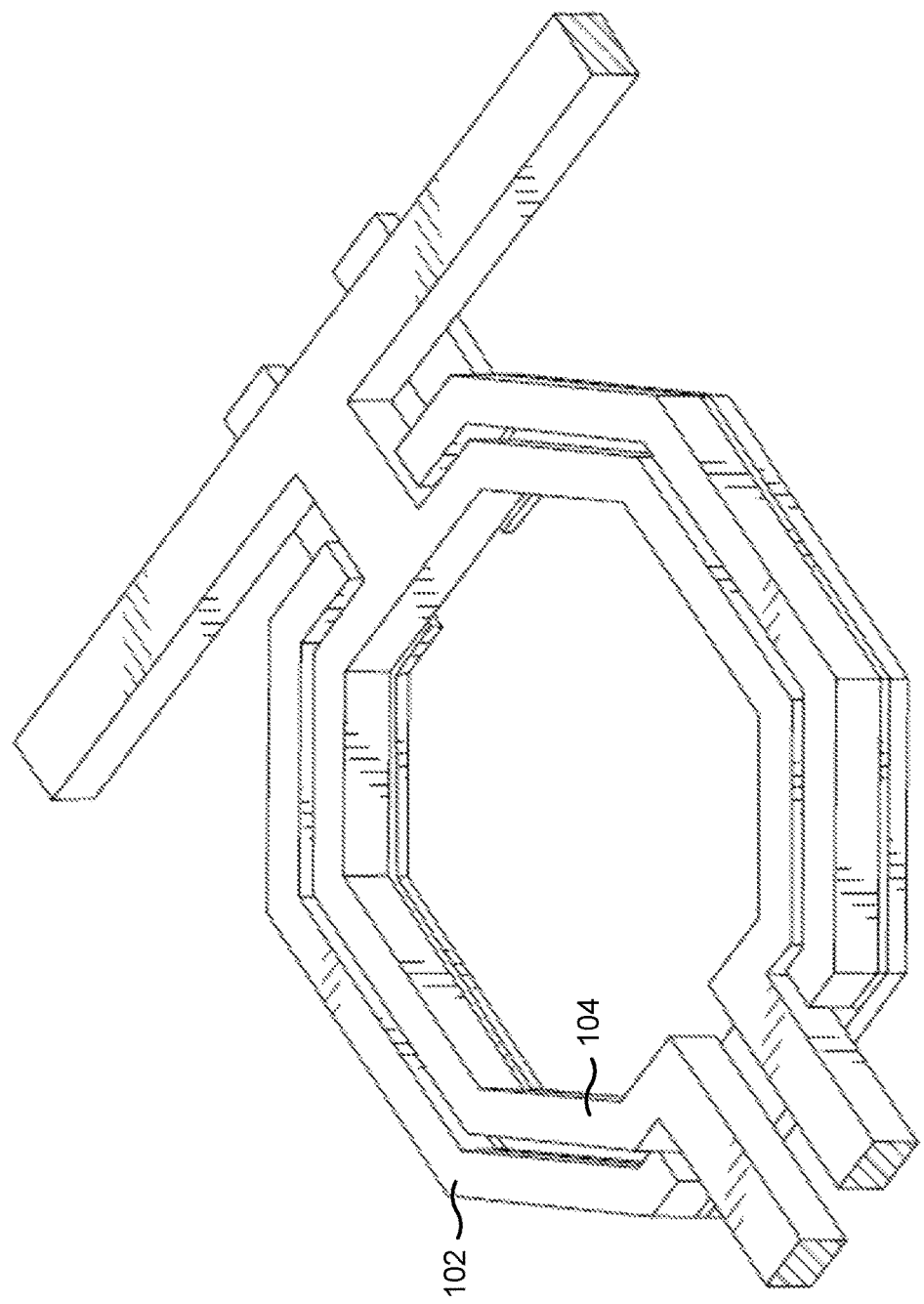
Figure 1C:
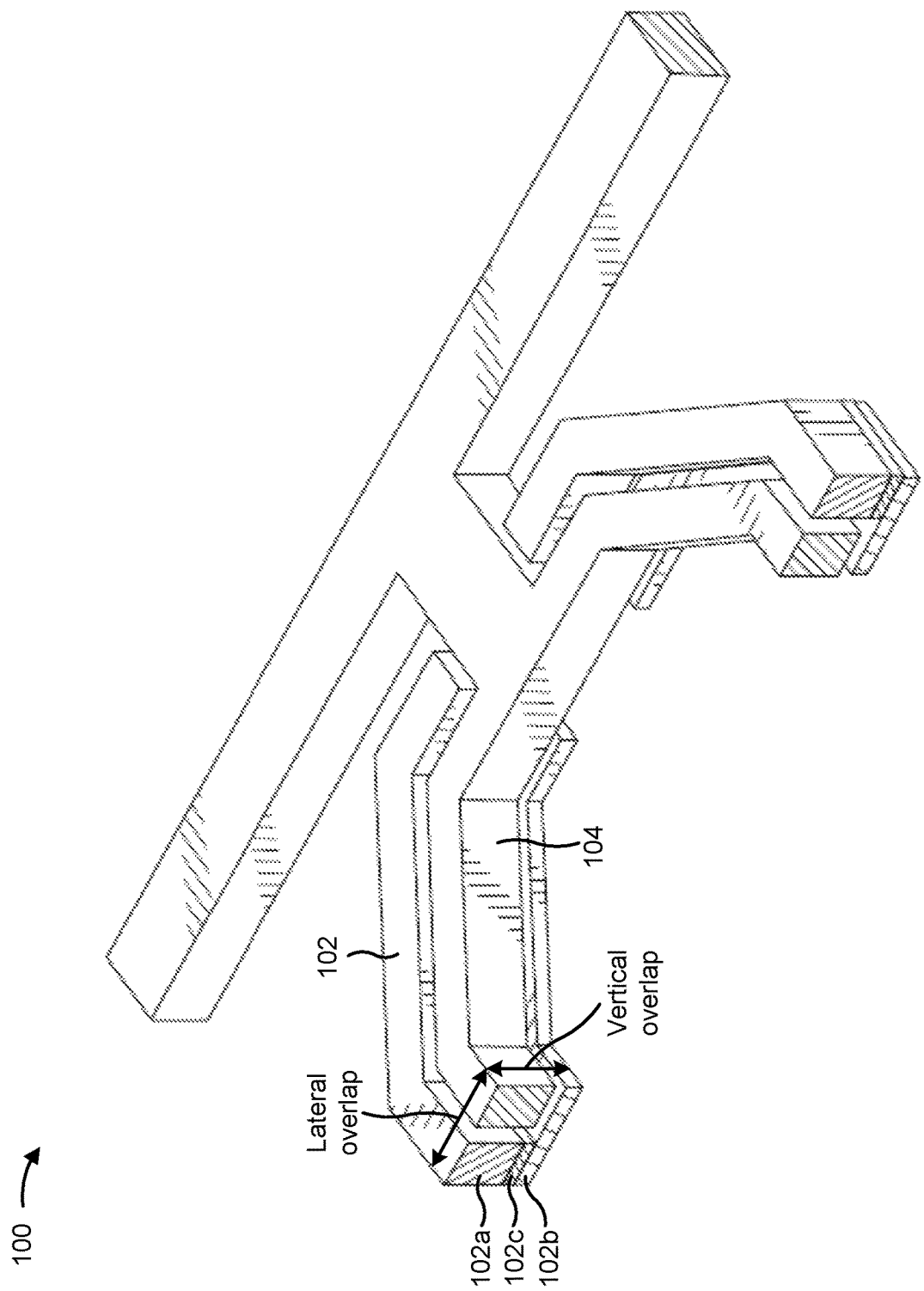
Figure 1D:
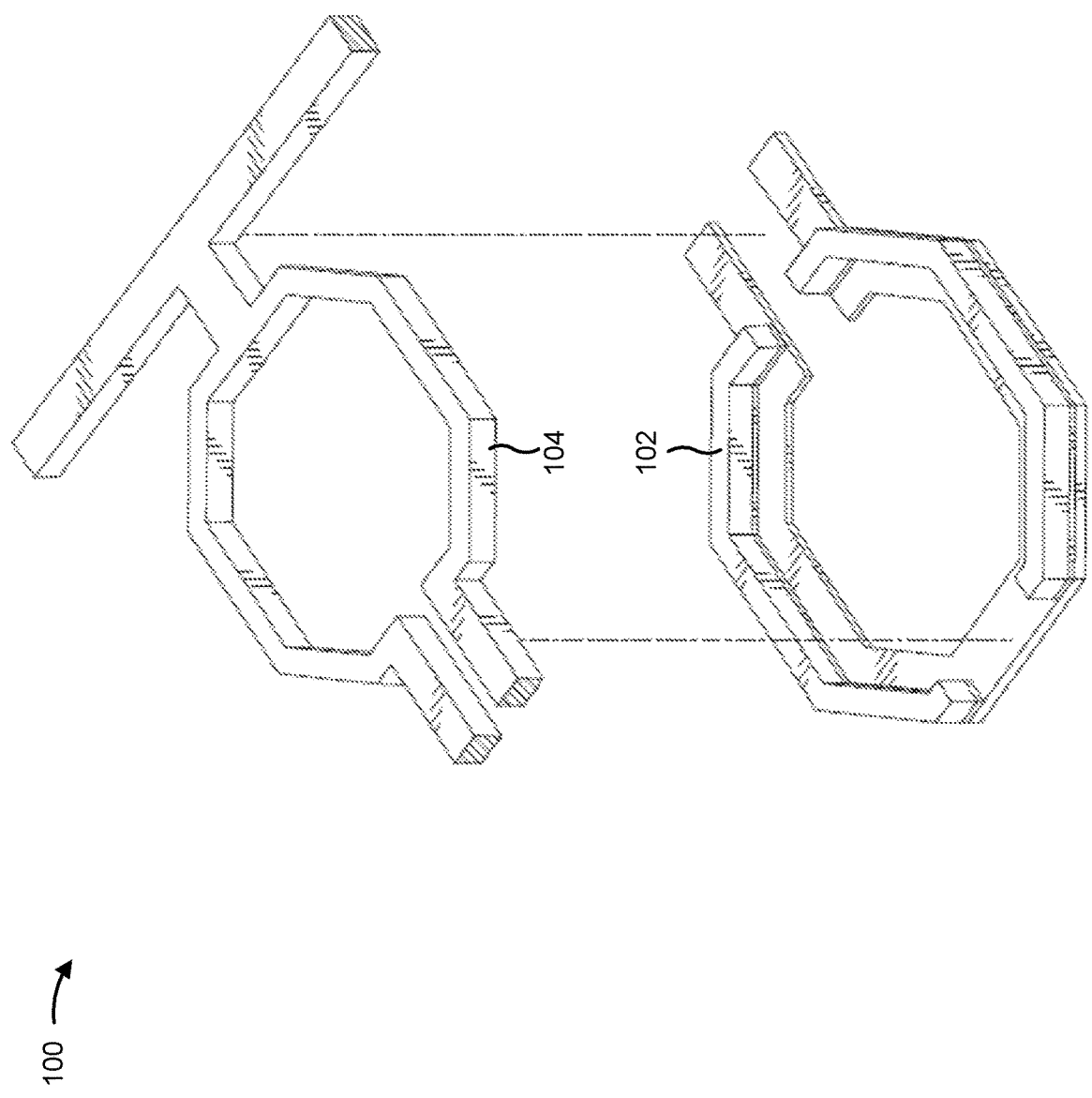

FIG. 1A illustrates a two-dimensional (2D) plan view of the first example implementation of transformer structure 100, FIG. 1B illustrates a three-dimensional (3D) view of the first example implementation of transformer structure 100, FIG. 1C illustrates a 3D cross-section of the first example implementation of transformer structure 100, and FIG. 1D illustrates a 3D exploded view of the first example implementation of transformer structure 100.

In some implementations, transformer structure 100 may include a first coil 102 having one or more turns and a second coil 104 having one or more turns. For example, as shown in FIGS. 1A-1D, the transformer structure 100 may include a first coil 102 and a second coil 104, each with a single turn. Notably, in other implementations, the first coil 102 and/or the second coil 104 can have multiple turns, and the number of turns of the first coil 102 need not match the number of turns of the second coil 104. In some implementations, the first coil 102 is a primary coil of the transformer structure 100 and the second coil 104 is a secondary coil of the transformer structure 100. Alternatively, in some implementations, the first coil 102 is a secondary coil of the transformer structure 100 and the second coil 104 is a primary coil of the transformer structure 100.

In some implementations, to provide the stacked and interleaved structure, a turn of the first coil 102 overlaps a turn of the second coil 104 in a lateral direction substantially along the turn of the first coil 102 and in a vertical direction substantially along the turn of the first coil 102. For example, in some implementations, a turn of the first coil 102 overlaps a turn of the second coil 104 in the lateral direction along more than a quarter of the turn (i.e., 25% of a length of the turn) of the first coil 102 and overlaps the turn of the second coil 104 in the vertical direction along more than a quarter of the turn of the first coil 102. In some implementations, as indicated in the cross-section of FIG. 1C, the overlap in the lateral direction is provided by a first portion 102a of the first coil 102, while the overlap in the vertical direction is provided by a second portion 102b of the first coil 102.

Notably, in the first example implementation, the first coil 102 is an outer coil of the transformer structure 100 and the second coil 104 is an inner coil of the transformer structure 100. However, in another implementation, the first coil 102 may be the inner coil of the transformer structure 100 and the second coil 104 may be the inner coil of the transformer structure 100. In such a case, the second portion 102b extends outward (e.g., from the inner coil toward the outer coil) rather than inward (e.g., from the outer coil toward the inner coil) as shown in the first example implementation of the transformer structure 100.

In some implementations, the first portion 102a is formed from a first metal layer (e.g., a thick metal layer) of a metal stack and the second portion 102b is formed from a second metal layer (e.g., a thin metal layer, a metal layer that is second from the top) of the metal stack. Here, as illustrated in FIG. 1C, the first portion 102a can be connected to the second portion 102b substantially along the turn of the first coil 102 through a via structure 102c between the first metal layer and the second metal layer. In some implementations, the second coil 104 is formed from the first metal layer. In the first example implementation of transformer structure 100, the first coil 102 is realized in the first metal layer and in the second metal layer (e.g., such that the first coil 102 extends below the second coil 104), while the second coil 104 is realized in the first metal layer. As a result of this stacked and interleaved structure, there will be lateral coupling and vertical coupling between the first coil 102 and the second coil 104 substantially along the turn of the first coil 102. Furthermore, extension of the first coil 102 below the second coil 104 improves isolation of the second coil 104 from a substrate, while causing increasing coupling between the first coil 102 and the substrate.

Notably, addition of the parallel metal path on the first coil 102 (i.e., the second portion 102b) may cause a difference between a Q factor of the first coil 102 and the second coil 104. However, in many applications, having equal Q factor on both the primary and secondary coils is not required. Furthermore, due to underpasses that are needed by the layout of the coil, the Q factor of a primary coil and a secondary coil in a conventional transformer structure layout are different in many cases. In some cases, the stacked/interleaved architecture of transformer structure 100 may not only not increase this difference in the Q factor, but may help to restore balance between the Q factors of the first coil 102 and the second coil 104. Further, the stacked/interleaved transformer structure may have an increased parasitic capacitance that shifts a self-resonance frequency (SRF) by a small amount (e.g., on the order of a few gigahertz). However, the SRF is typically far beyond a frequency of operation of the transformer structure 100 and, therefore, such a shift in does not significantly impact performance of the transformer structure 100.

FIGS. 1E-1H are diagrams illustrating examples of simulated improvements in transformer performance parameters provided by the first example implementation of the transformer structure 100 (e.g., in which the first coil 102 is the outer coil and the second coil 104 is the inner coil). In the examples associated with FIGS. 1E-1H, the first coil 102 is the secondary coil and the second coil 104 is the primary coil. In FIGS. 1E-1H, lines corresponding to performance parameters of the first example implementation of the transformer structure 100 are labeled with "TS100," and lines corresponding to performance parameters of a conventional transformer structure (a transformer structure having an interleaved structure only) are labeled with "ILTS."

Figure 1E:
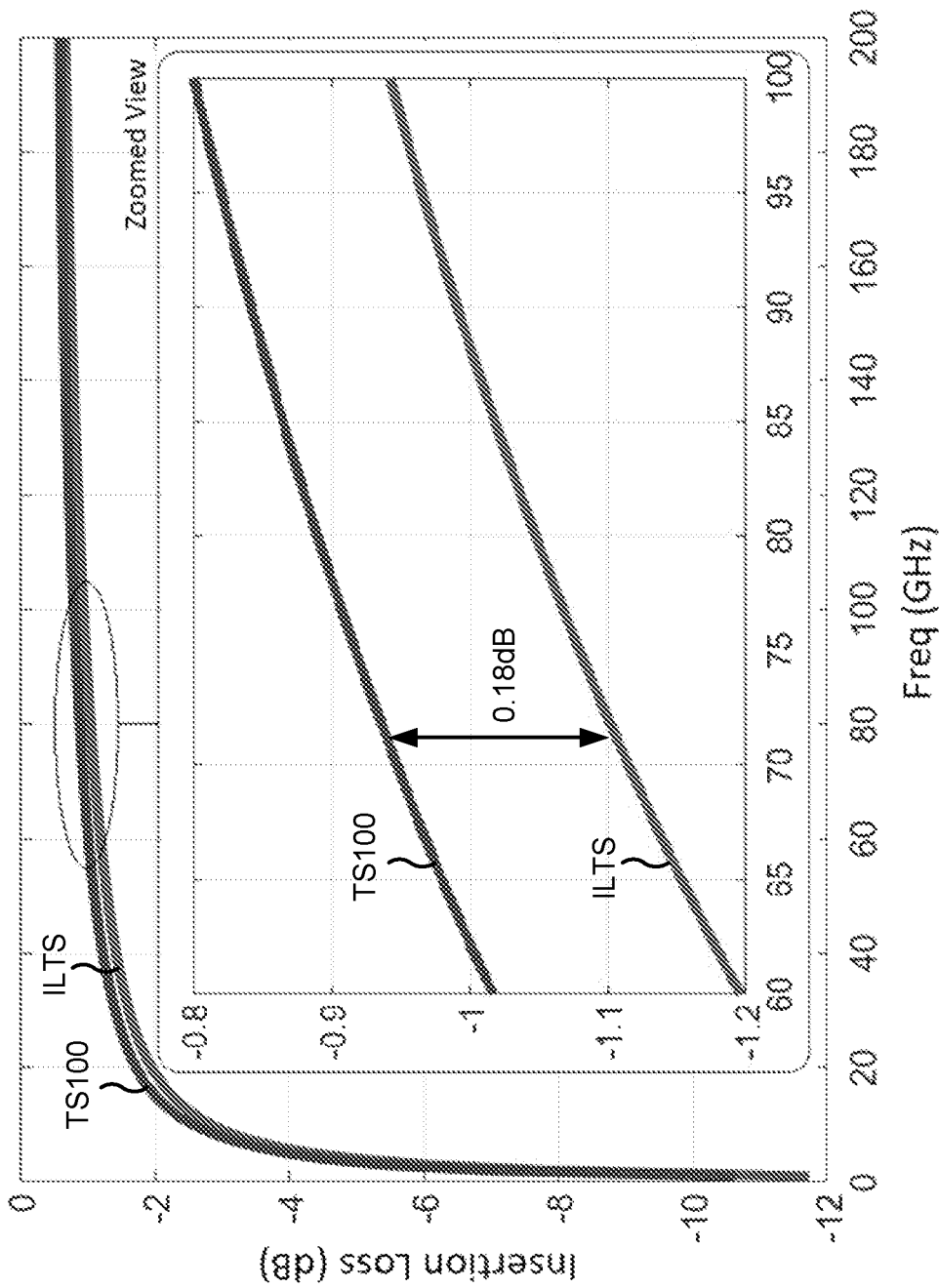

FIG. 1E illustrates an improvement in insertion loss provided by the first example implementation of transformer structure 100. As shown in FIG. 1E, in a possible range of operation of transformer structure (e.g., between approximately 60 gigahertz (GHz) and approximately 100 GHz), the first example implementation of the transformer structure 100 may reduce insertion loss by approximately 0.18 decibels (dB) as compared to the conventional transformer structure.

Figure 1F:
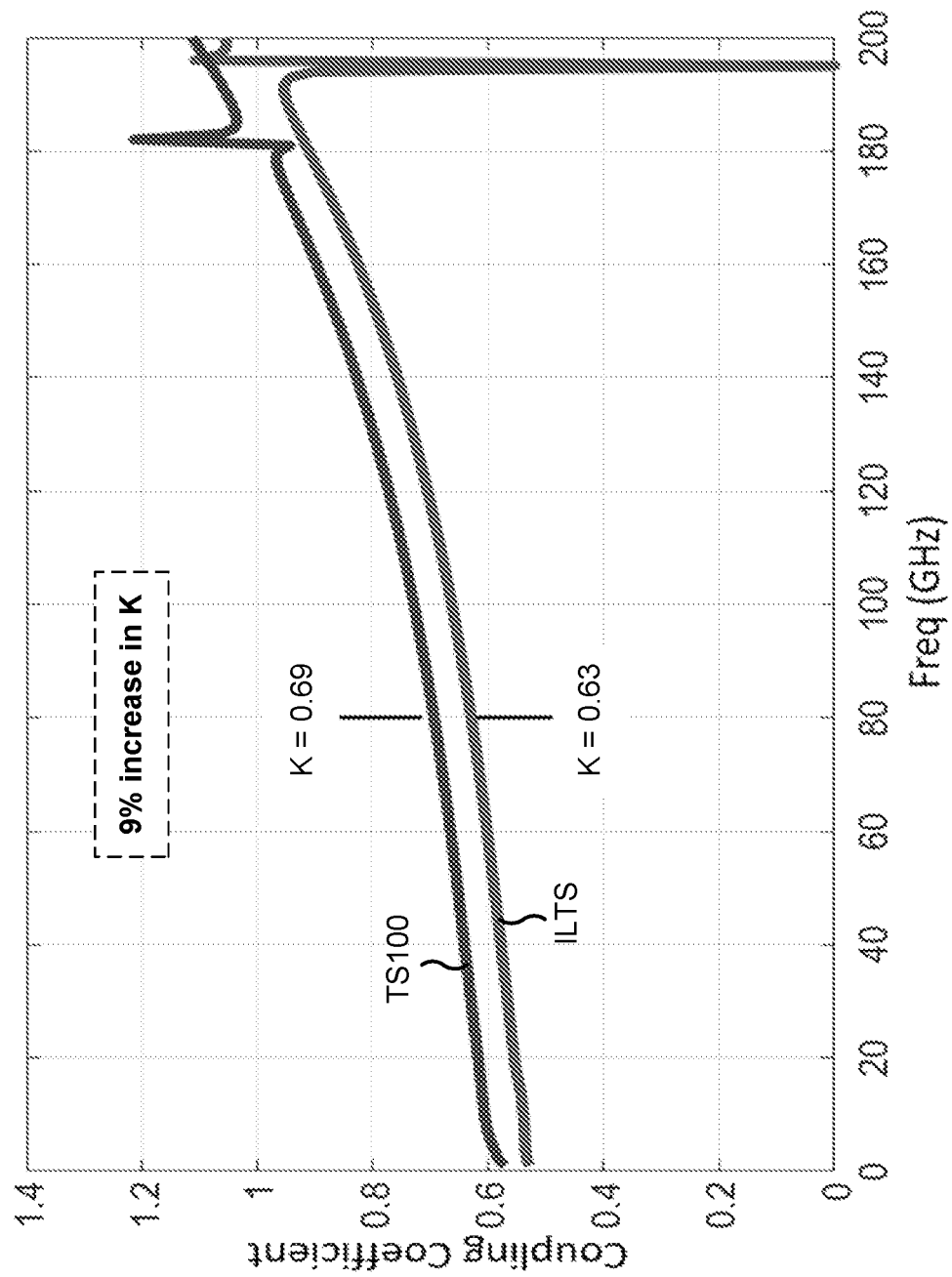

FIG. 1F illustrates an improvement in a coupling coefficient (K) provided by the first example implementation of transformer structure 100. As shown in FIG. 1F, the first example implementation of the transformer structure 100 may increase the coupling coefficient by approximately 0.06 (i.e., by approximately 9%) as compared to the conventional transformer structure.

Figure 1G:
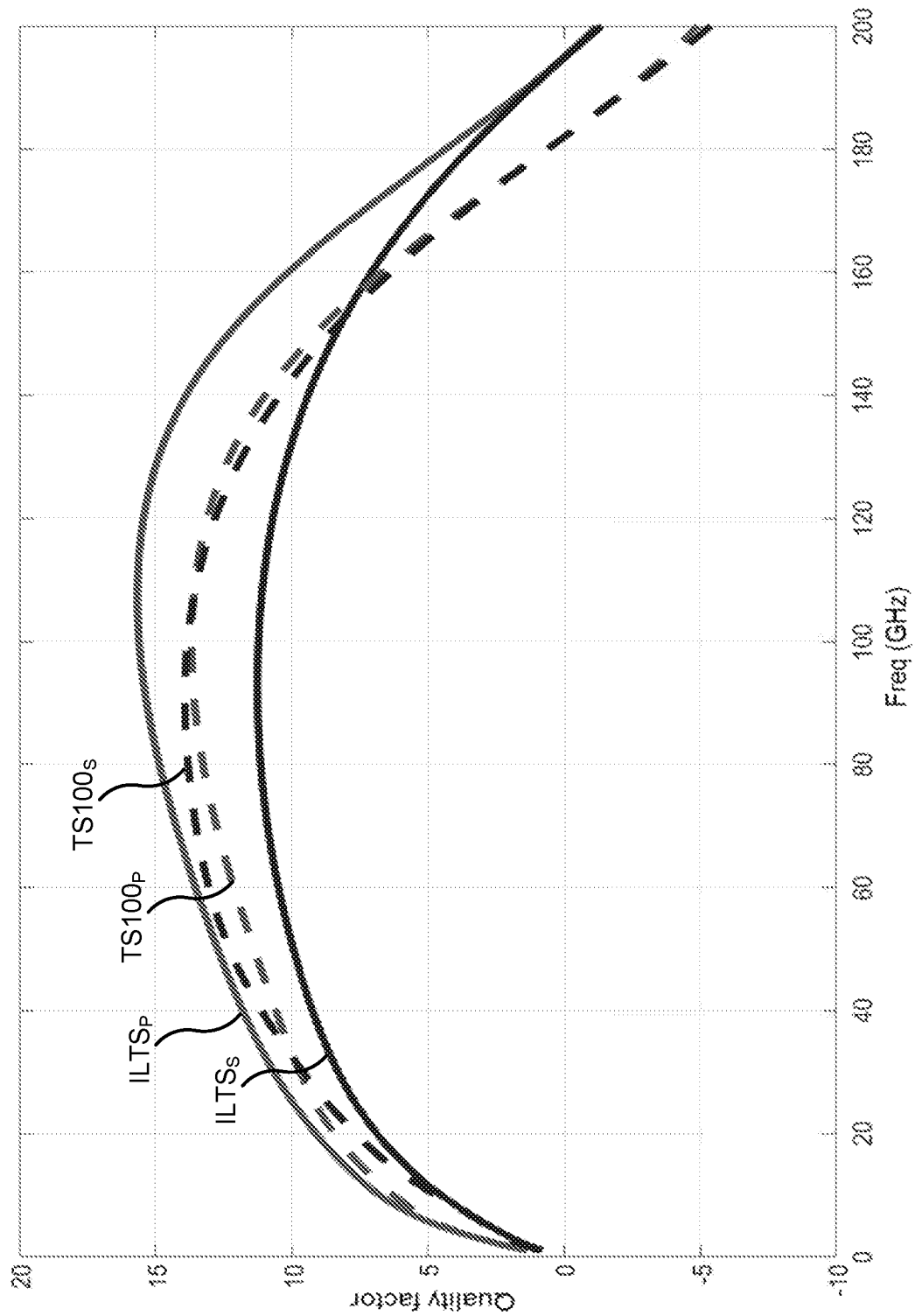

FIG. 1G illustrates an improvement in Q factor matching of the primary and secondary coils provided by the first example implementation of transformer structure 100. In FIG. 1G, the Q factor of the primary coil of the first example implementation of transformer structure 100 is identified as "TS100$_P$," the Q factor of the secondary coil of the first example implementation of transformer structure 100 is identified as "TS100$_S$," the Q factor of the primary coil of the conventional transformer structure is identified as "ILTS$_P$," and the Q factor of the secondary coil of the conventional transformer structure is identified as "ILTS$_S$." As shown in FIG. 1G, in the first example implementation of the transformer structure 100, the Q factors of the primary and secondary coils of the first example implementation of transformer structure 100 are more closely matched than the Q factors of the primary and secondary coils of the conventional transformer structure.

Figure 1H:
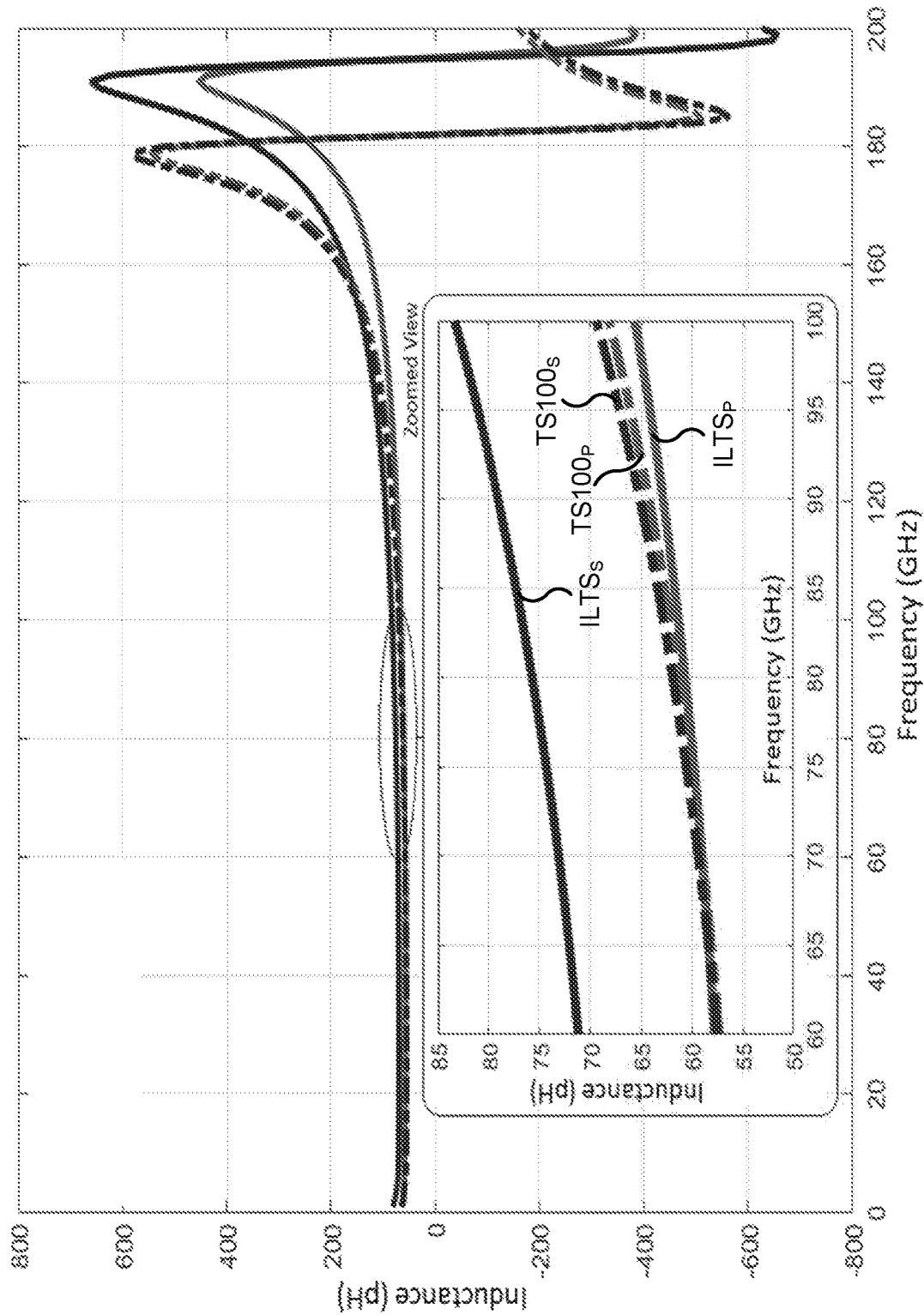

FIG. 1H illustrates an impact on inductance of the first example implementation of transformer structure 100. In FIG. 1H, the inductance of the primary coil of the first example implementation of transformer structure 100 is identified as "TS100$_P$," the inductance of the secondary coil of the first example implementation of transformer structure 100 is identified as "TS100$_S$," the inductance of the primary coil of the conventional transformer structure is identified as "ILTS$_P$," and the inductance of the secondary coil of the conventional transformer structure is identified as "ILTS$_S$." As shown in FIG. 1H, in the first example implementation of the transformer structure 100, the inductance of the secondary coil of the first example implementation of the transformer structure 100 may be lower than the inductance of the secondary coil of the conventional transformer structure. Further, as shown, the primary and secondary coils of the first example implementation of transformer structure 100 are more closely matched than the inductance of the primary and secondary coils of the conventional transformer structure.

As indicated above, FIGS. 1A-1H are provided as examples. Other examples may differ from what is described with regard to FIGS. 1A-1H. The number and arrangement of coils, turns, and layers shown in FIGS. 1A-1H are provided as an example. In practice, there may be additional turns, additional layers, fewer turns, fewer layers, different coils, different turns, different layers, differently shaped coils, differently shaped turns, differently shaped layers, differently arranged coils, differently arranged turns, or differently arranged layers than those shown in FIGS. 1A-1H. Further, the dimensions of coils, turns, and layers shown in FIGS. 1A-1H are provided as an example. In practice, the coils, turns, and/or layers may have different dimensions or different relative dimensions than those shown in FIGS. 1A-1H.

FIGS. 2A-2D are diagrams illustrating improvements in transformer performance parameters provided by a second example implementation of the transformer structure 100. In the second example implementation of the transformer structure 100, the first coil 102 is the inner coil and the second coil 104 is the outer coil (e.g., such that the second portion 102b of the first coil 102 extends outward beneath the second coil 104). In the examples associated with FIGS. 2A-2D the first coil 102 is the primary coil and the second coil 104 is the secondary coil. In FIGS. 2A-2D, lines corresponding to performance parameters of the second example implementation of the transformer structure 100 are labeled with "TS100," and lines corresponding to performance parameters of a conventional transformer structure (a transformer structure having an interleaved structure only) are labeled with "ILTS."

Figure 2A:
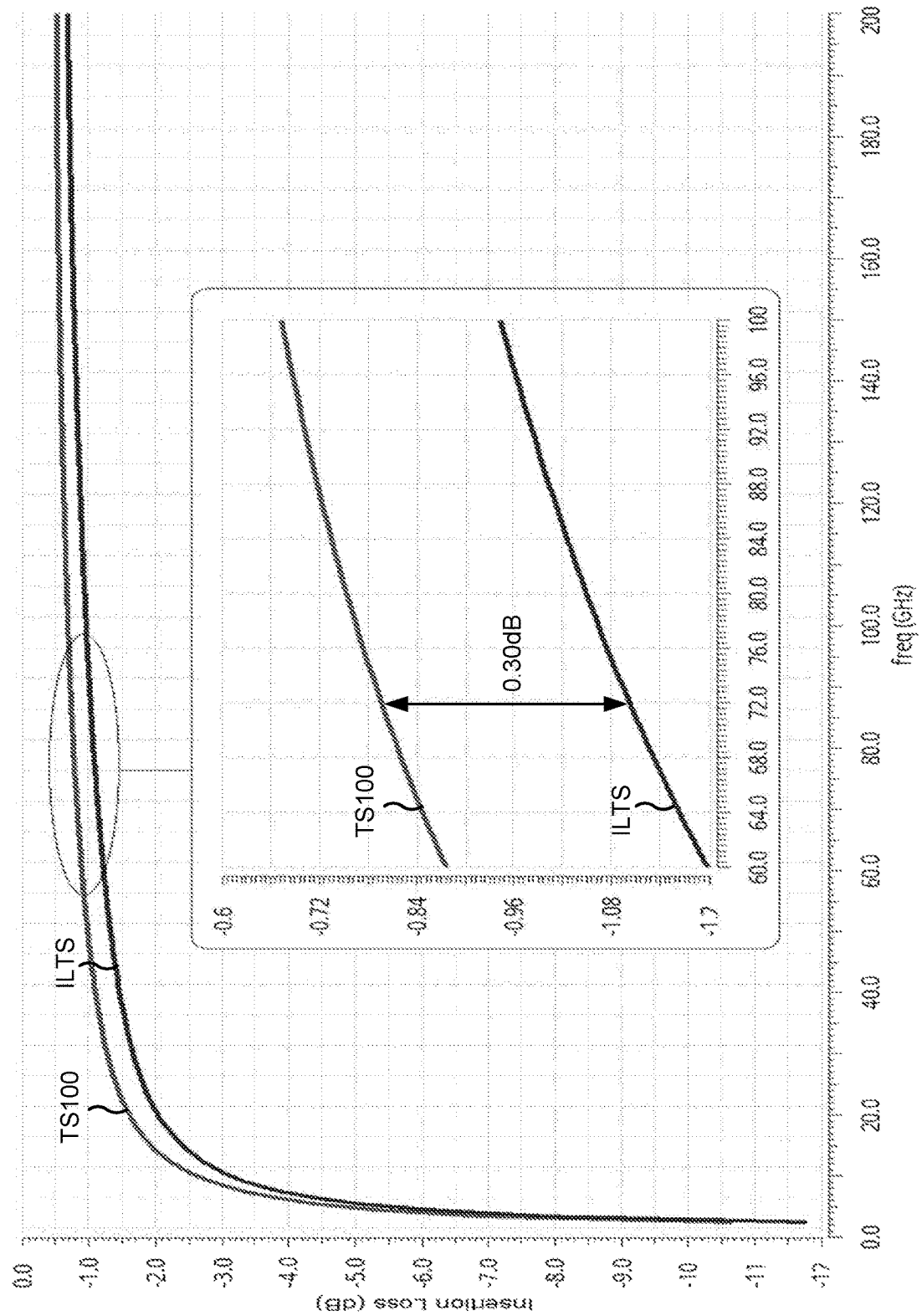
FIGS. 2A-2D are diagrams associated with a second example implementation of a transformer structure that includes a stacked and interleaved architecture, as described herein.

FIG. 2A illustrates an improvement in insertion loss provided by the second example implementation of transformer structure 100. As shown in FIG. 2A, in a possible range of operation of transformer structure (e.g., between approximately 60 GHz and approximately 100 GHz), the second example implementation of the transformer structure 100 may reduce insertion loss by approximately 0.30 dB as compared to the conventional transformer structure.

Figure 2B:
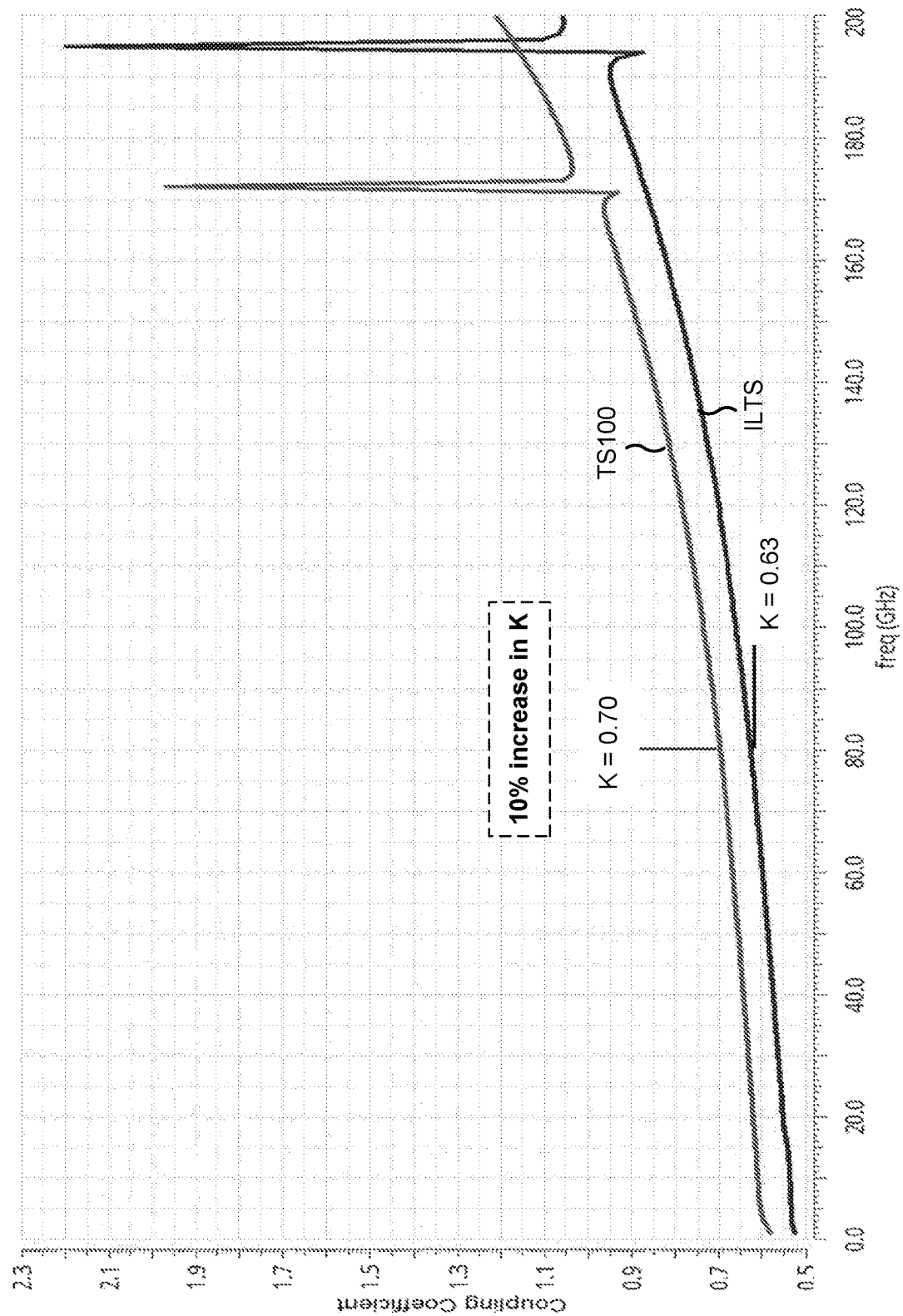

FIG. 2B illustrates an improvement in a coupling coefficient provided by the second example implementation of transformer structure 100. As shown in FIG. 2B, the second example implementation of the transformer structure 100 may increase the coupling coefficient by approximately 0.07 (i.e., by approximately 10%) as compared to the conventional transformer structure.

Figure 2C:
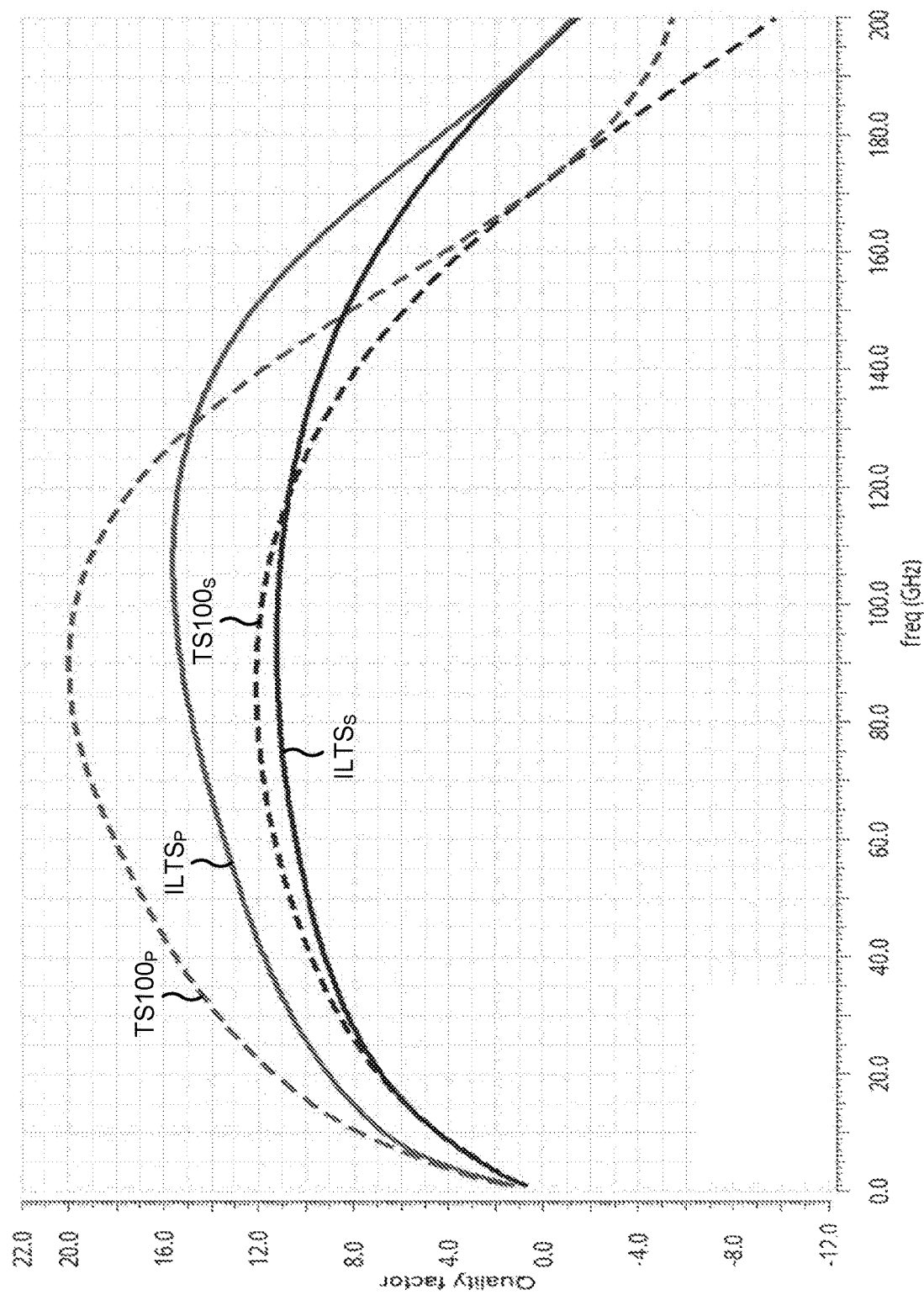

FIG. 2C illustrates a change in Q factor of the primary and secondary coils provided by the second example implementation of transformer structure 100. In FIG. 2C, the Q factor of the primary coil of the second example implementation of transformer structure 100 is identified as "TS100$_P$," the Q factor of the secondary coil of the second example implementation of transformer structure 100 is identified as "TS100$_S$," the Q factor of the primary coil of the conventional transformer structure is identified as "ILTS$_P$," and the Q factor of the secondary coil of the conventional transformer structure is identified as "ILTS$_S$." As shown in FIG. 2C, in the second implementation of the transformer structure 100, a difference in the Q factors of the primary and secondary coils of the second example implementation of transformer structure 100 may, at most frequencies, be larger than a difference between the Q factors of the primary and secondary coils of the conventional transformer structure. In some implementations, the difference between the Q factors associated with the second example implementation of the transformer structure 100 may be designed so as to provide a desired difference in Q factors.

Figure 2D:
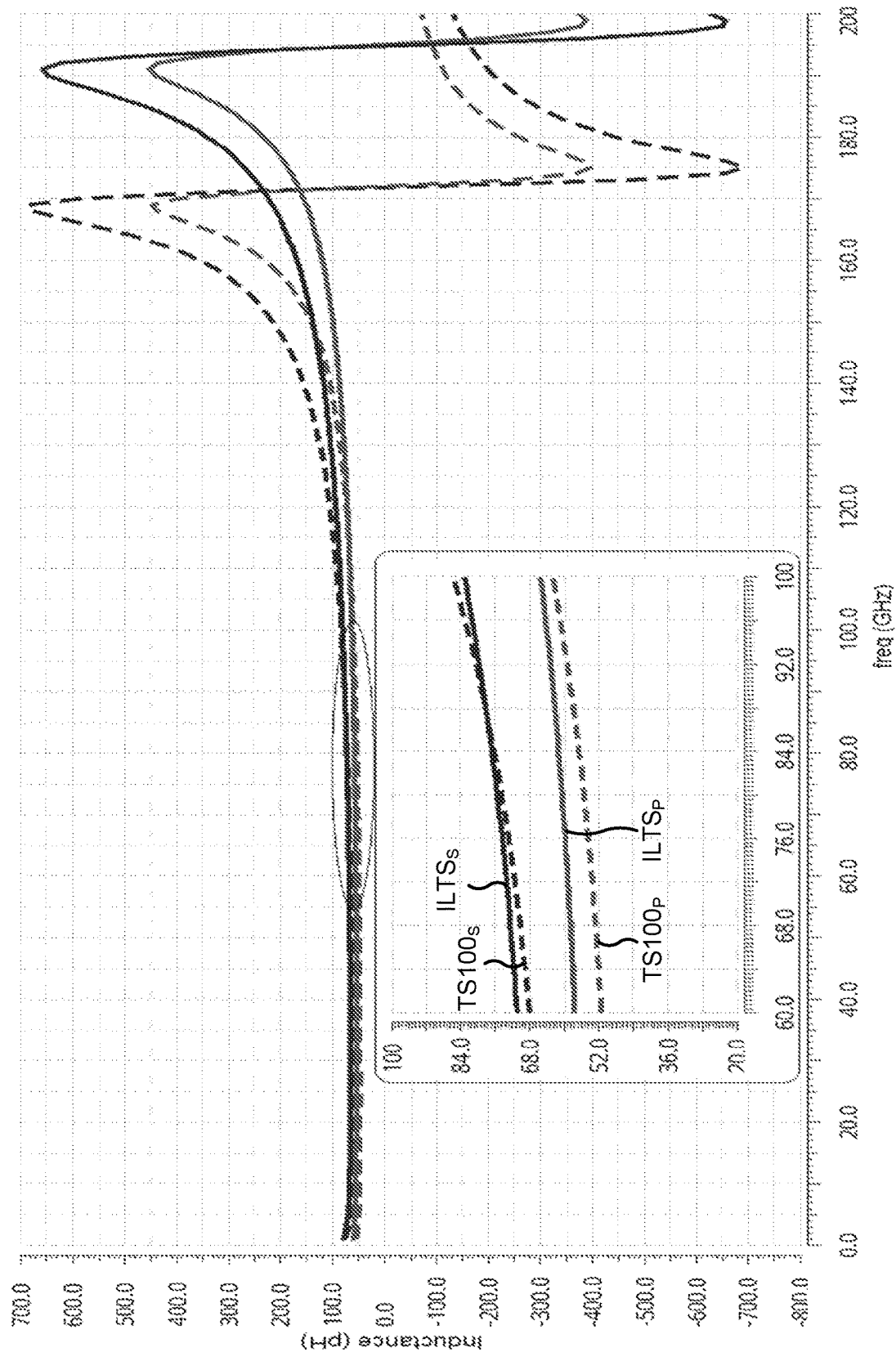

FIG. 2D illustrates an impact on inductance of the second example implementation of transformer structure 100. In FIG. 2D, the inductance of the primary coil of the second example implementation of transformer structure 100 is identified as "TS100$_P$," the inductance of the secondary coil of the second example implementation of transformer structure 100 is identified as "TS100$_S$," the inductance of the primary coil of the conventional transformer structure is identified as "ILTS$_P$," and the inductance of the secondary coil of the conventional transformer structure is identified as "ILTS$_S$." As shown in FIG. 2D, in the second example implementation of the transformer structure 100, the inductance of the primary coil of the second example implementation of the transformer structure may be lower than that of the primary coil of the conventional transformer structure across a range of operation, and the inductance of the secondary coil of the second example implementation of the transformer structure 100 may be lower than the inductance of the secondary coil of the conventional transformer structure across a majority of the range of operation.

As indicated above, FIGS. 2A-2D are provided as examples. Other examples may differ from what is described with regard to FIGS. 2A-2D.

Figure 3A:
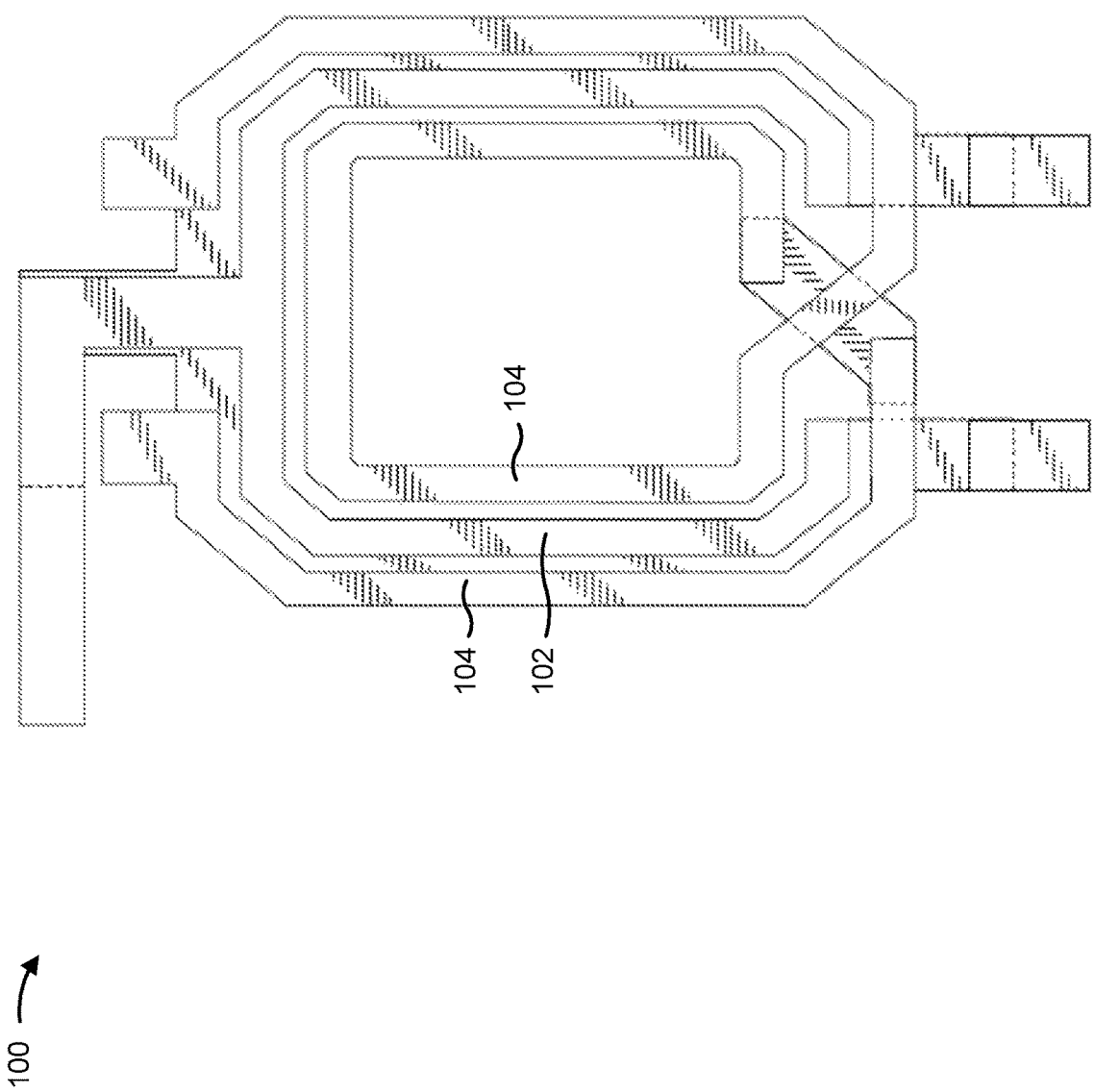
FIGS. 3A-3J are diagrams associated with a third example implementation of a transformer structure that includes a stacked and interleaved architecture, as described herein.
Figure 3B:
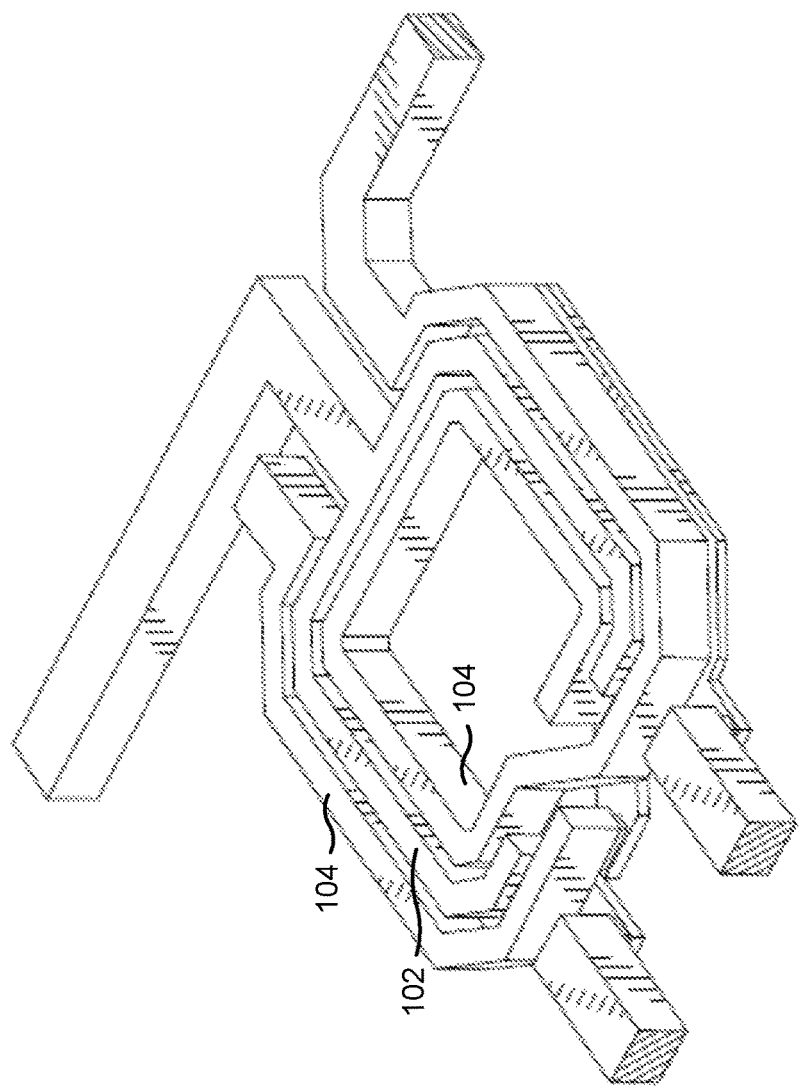
Figure 3C:
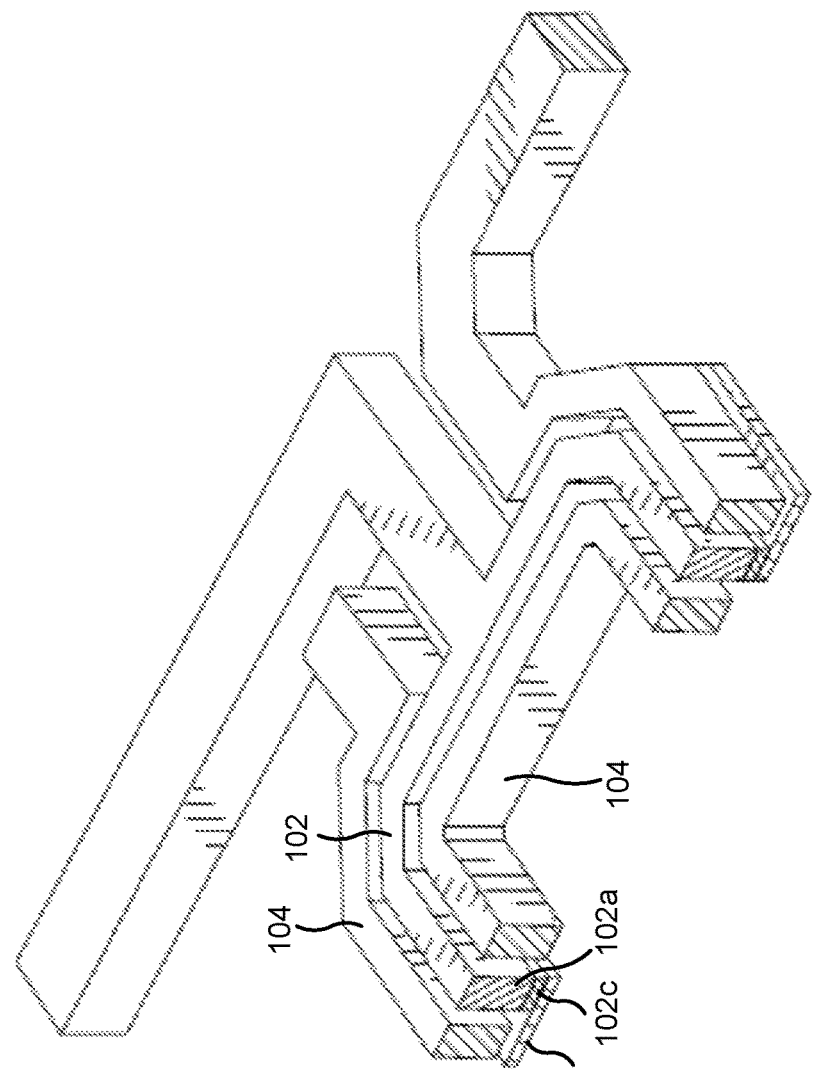
Figure 3D:
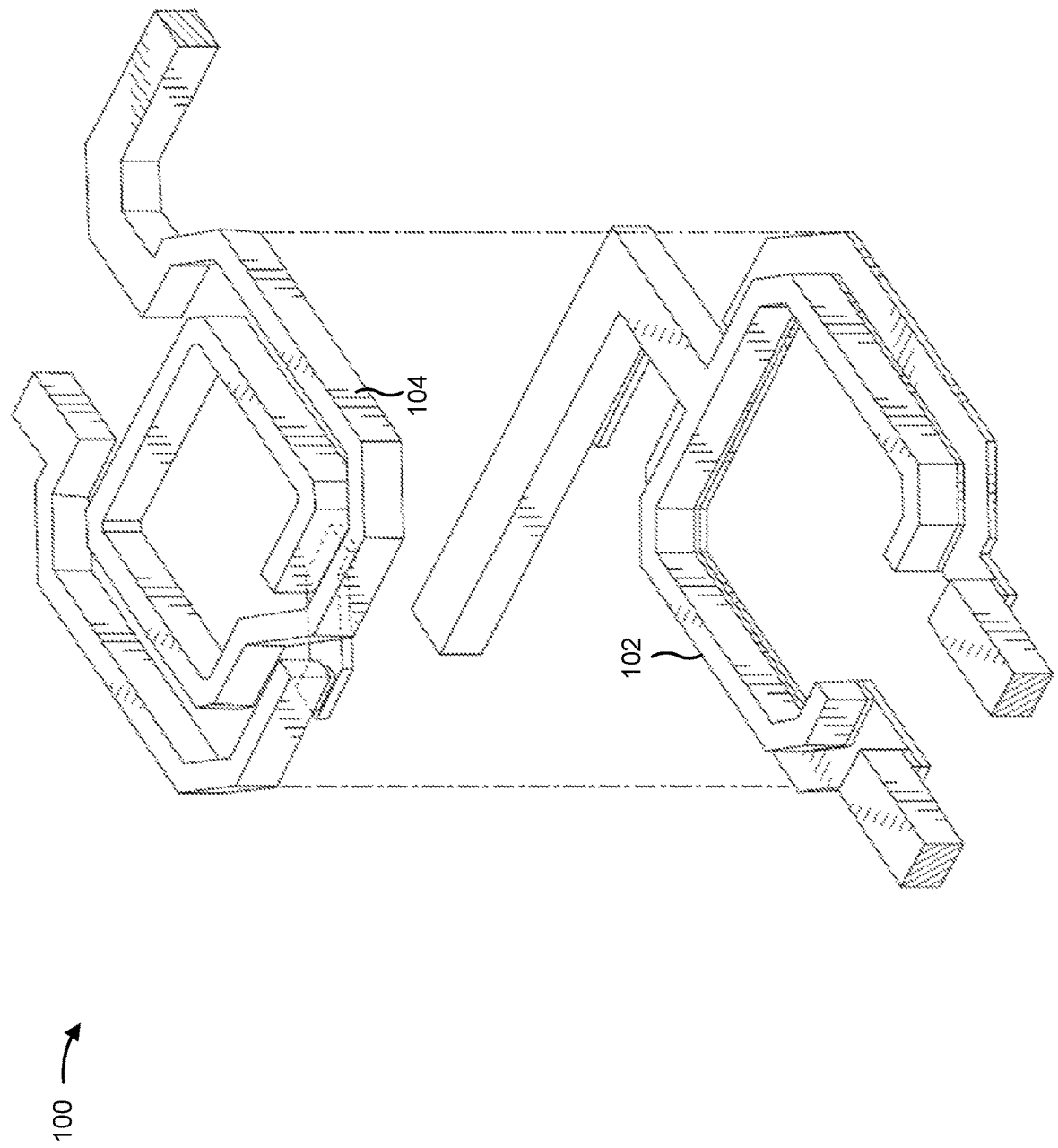

FIGS. 3A-3J are diagrams associated with a third example implementation of the transformer structure 100. The third example implementation of the transformer structure 100 is a 2:1 transformer. FIG. 3A illustrates a 2D plan view of the third example implementation of transformer structure 100, FIG. 3B illustrates a 3D view of the third example implementation of transformer structure 100, FIG. 3C illustrates a 3D cross-section of the third example implementation of transformer structure 100, and FIG. 3D illustrates a 3D exploded view of the third example implementation of transformer structure 100. Notably, FIGS. 3A-3D show half of a 1:2 power combiner.

In some implementations, transformer structure 100 may include a first coil 102 having one or more turns and a second coil 104 having one or more turns, as described above. For example, as shown in FIGS. 3A-3D, the transformer structure 100 may include a first coil 102 having one turn, and a second coil 104 having two turns.

In some implementations, as described above, to provide the stacked and interleaved structure, a turn of the first coil 102 overlaps a turn of the second coil 104 in a lateral direction substantially along the turn of the first coil 102 and in a vertical direction substantially along the turn of the first coil 102. In some implementations, as indicated in the cross-section of FIG. 3C, the overlap in the lateral direction is provided by a first portion 102a of the first coil 102, while the overlap in the vertical direction is provided by a second portion 102b of the first coil 102.

Notably, in the third example implementation, the first coil 102 is a middle coil of the transformer structure 100 and the second coil 104 comprises an inner coil (forming a first turn) and an outer coil (forming a second turn) of the transformer structure 100. As shown, the second portion 102b extends outward toward the outer coil of the second coil 104 in the third example implementation. However, in another implementation, the second portion 102b of the first coil 102 may extends inward (e.g., beneath the inner coil of the second coil 104).

FIGS. 3E-3J are diagrams illustrating examples of simulated improvements in transformer performance parameters provided by the third example implementation of the transformer structure 100 (e.g., a combiner). In the examples associated with FIGS. 3E-3J, the first coil 102 is the secondary coil and the second coil 104 is the primary coil. In FIGS. 3E-3J, lines corresponding to performance parameters of the third example implementation of the transformer structure 100 are labeled with "TS100," and lines corresponding to performance parameters of a conventional combiner transformer structure (a transformer structure having an interleaved structure only) are labeled with "ILTS."

Figure 3E:
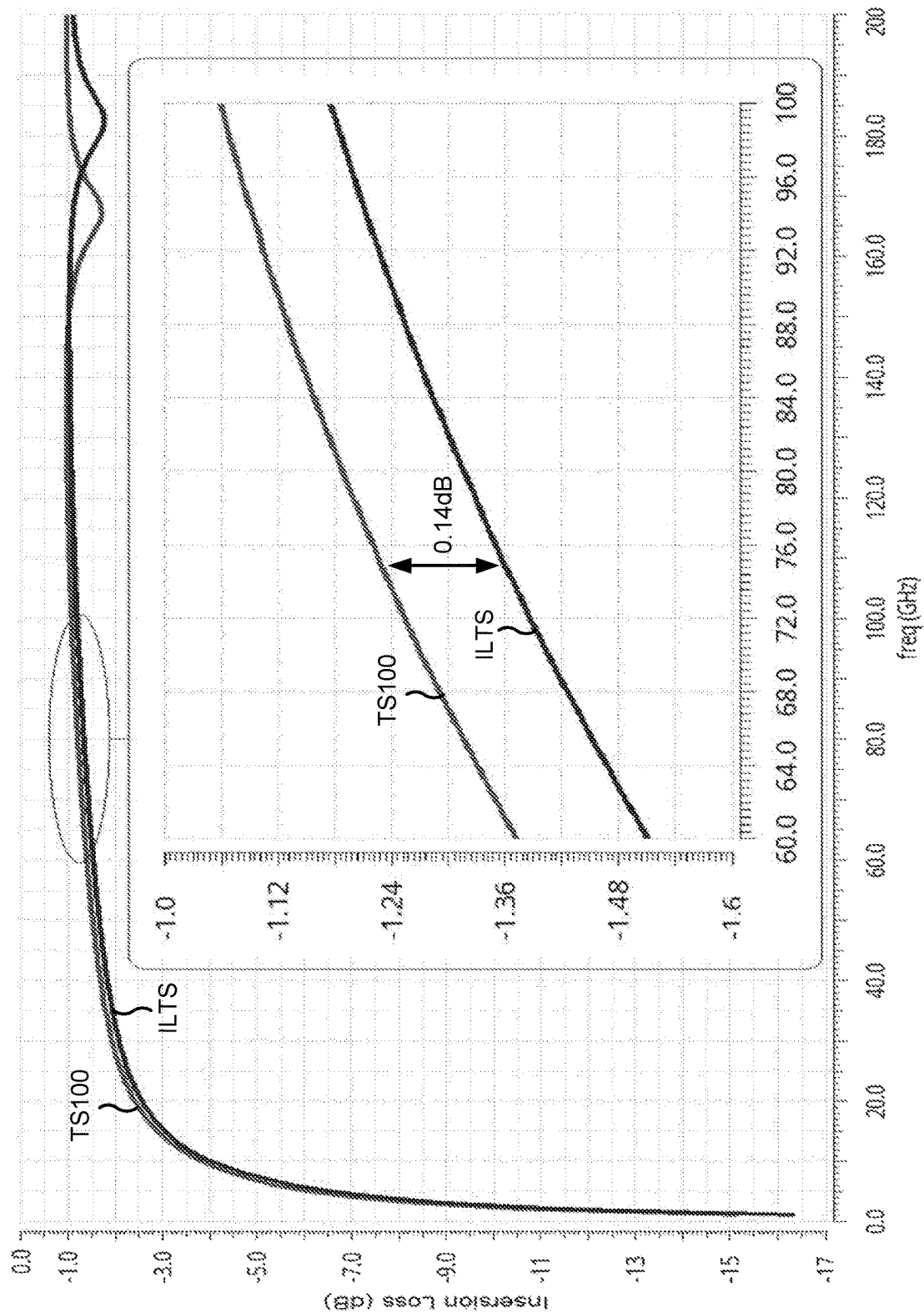

FIG. 3E illustrates an improvement in insertion loss provided by the third example implementation of transformer structure 100. As shown in FIG. 3E, in a possible range of operation of transformer structure (e.g., between approximately 60 GHz and approximately 100 GHz), the third example implementation of the transformer structure 100 may reduce insertion loss by approximately 0.14 dB as compared to the conventional combiner transformer structure.

Figure 3F:
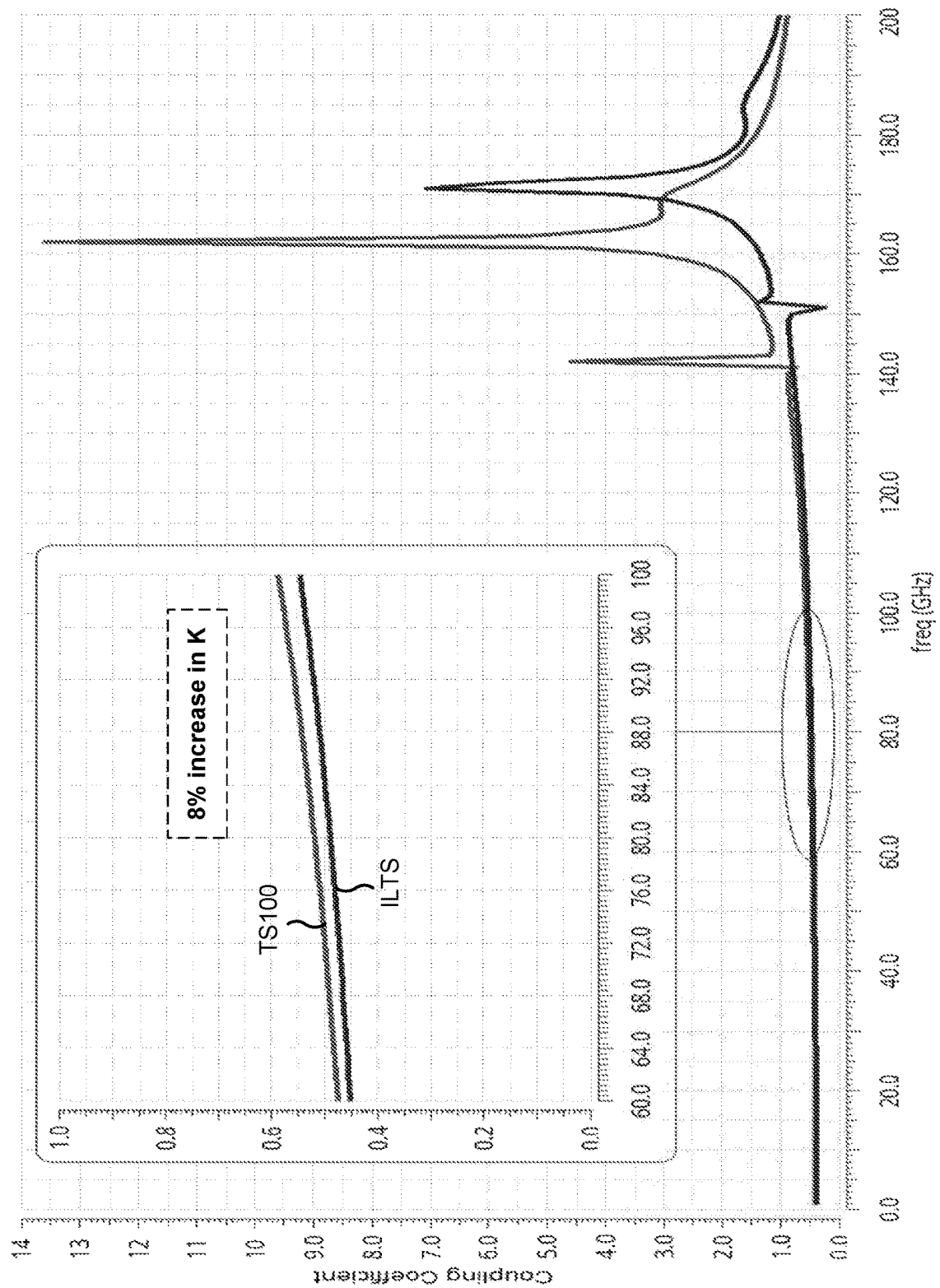

FIG. 3F illustrates an improvement in a coupling coefficient provided by the third example implementation of transformer structure 100. As shown in FIG. 3F, the third example implementation of the transformer structure 100 may increase the coupling coefficient by approximately 8% as compared to the conventional combiner transformer structure.

Figure 3G:
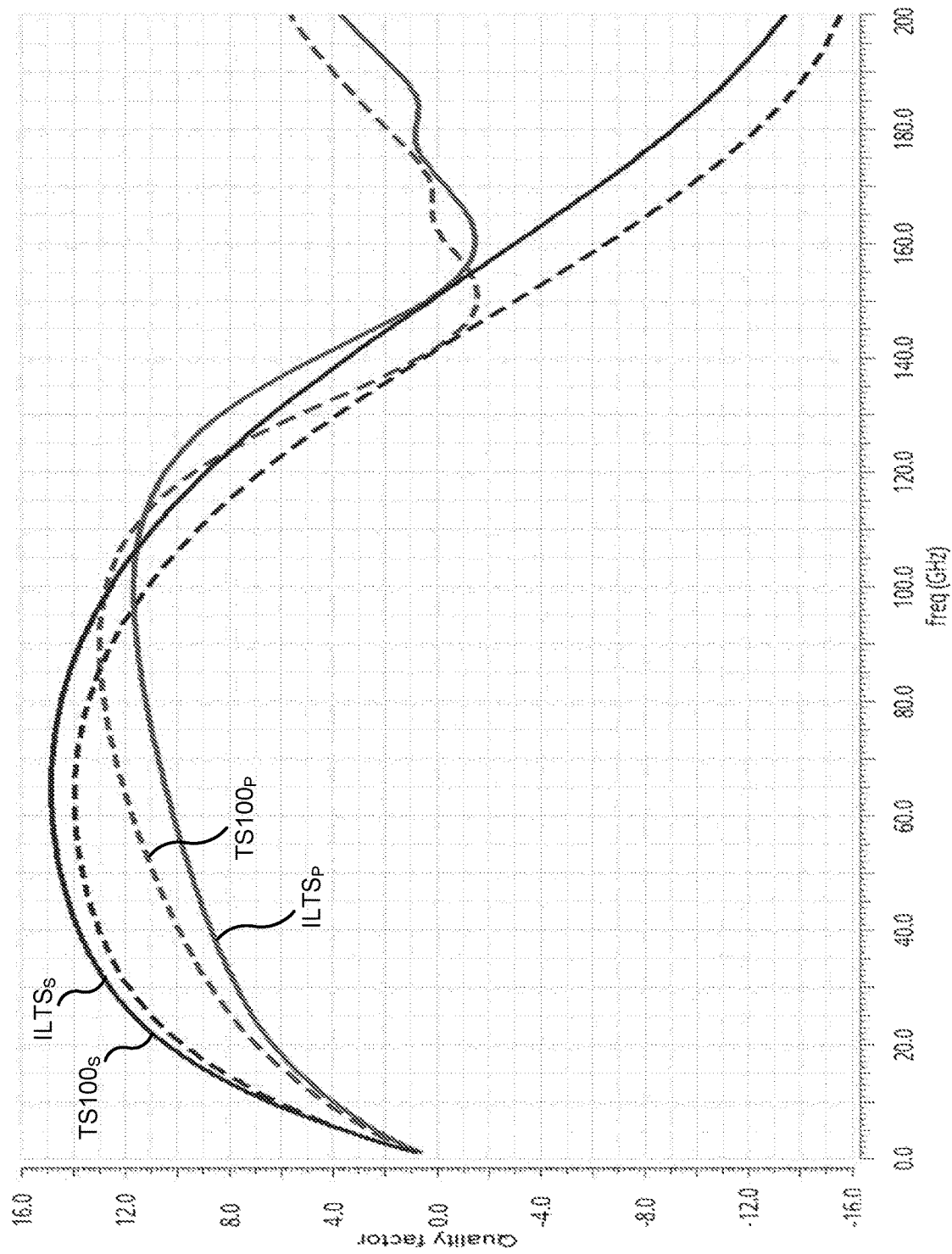

FIG. 3G illustrates an improvement in Q factor matching of the primary and secondary coils provided by the third example implementation of transformer structure 100. In FIG. 3G, the Q factor of the primary coil of the third example implementation of transformer structure 100 is identified as "TS100$_P$," the Q factor of the secondary coil of the third example implementation of transformer structure 100 is identified as "TS100$_S$," the Q factor of the primary coil of the conventional combiner transformer structure is identified as "ILTS$_P$," and the Q factor of the secondary coil of the conventional combiner transformer structure is identified as "ILTS$_S$." As shown in FIG. 3G, in the third example implementation of the transformer structure 100, the Q factors of the primary and secondary coils of the third example implementation of transformer structure 100 are more closely matched than the Q factors of the primary and secondary coils of the conventional combiner transformer structure.

Figure 3H:
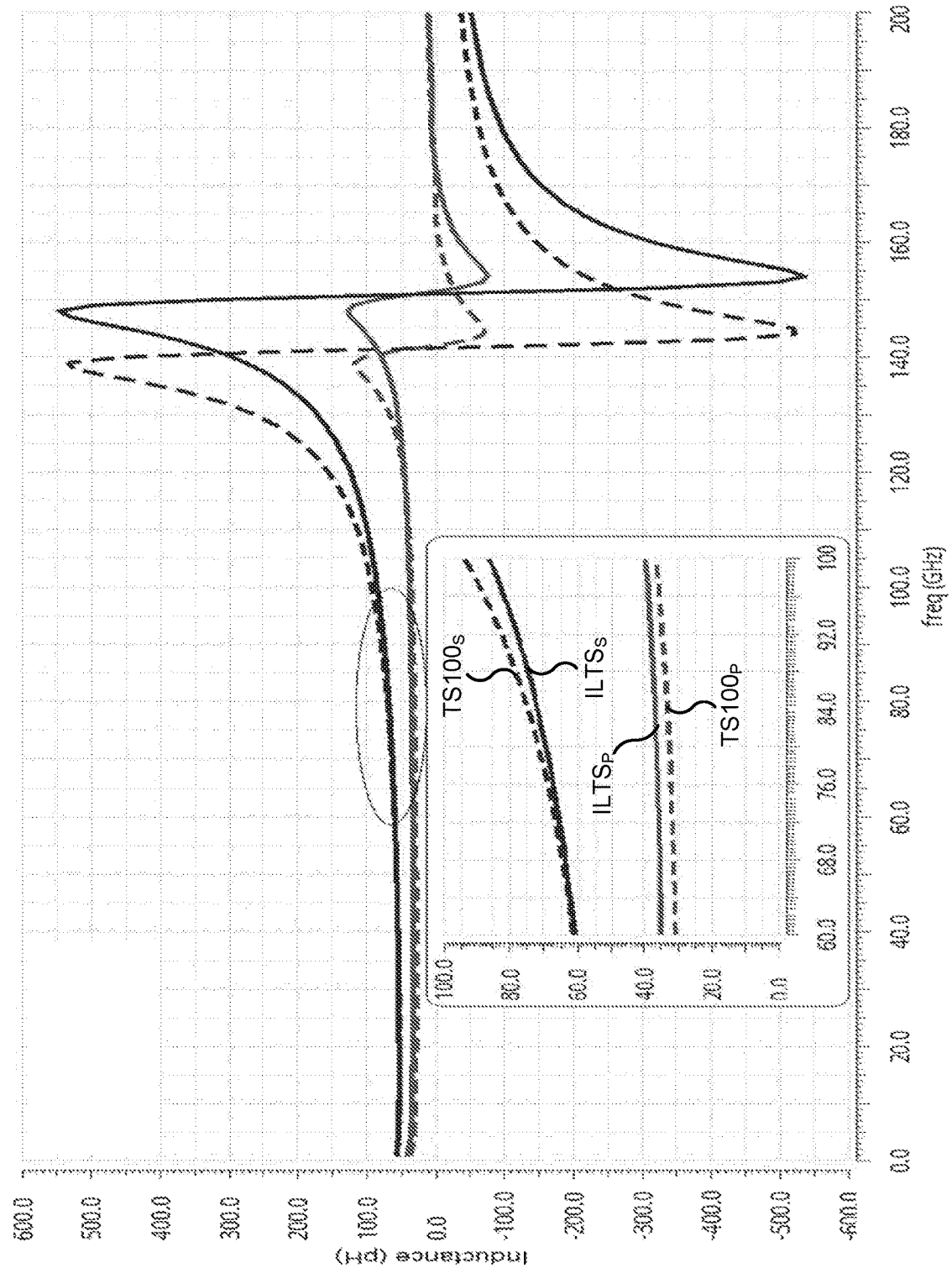

FIG. 3H illustrates an impact on inductance of the third example implementation of transformer structure 100. In FIG. 3H, the inductance of the primary coil of the third example implementation of transformer structure 100 is identified as "TS100$_P$," the inductance of the secondary coil of the third example implementation of transformer structure 100 is identified as "TS100$_S$," the inductance of the primary coil of the conventional combiner transformer structure is identified as "ILTS$_P$," and the inductance of the secondary coil of the conventional combiner transformer structure is identified as "ILTS$_S$." As shown in FIG. 3H, in the third example implementation of the transformer structure 100, the inductance of the secondary coil of the third example implementation of the transformer structure 100 may be lower than the inductance of the secondary coil of the conventional combiner transformer structure.

Figure 3I:
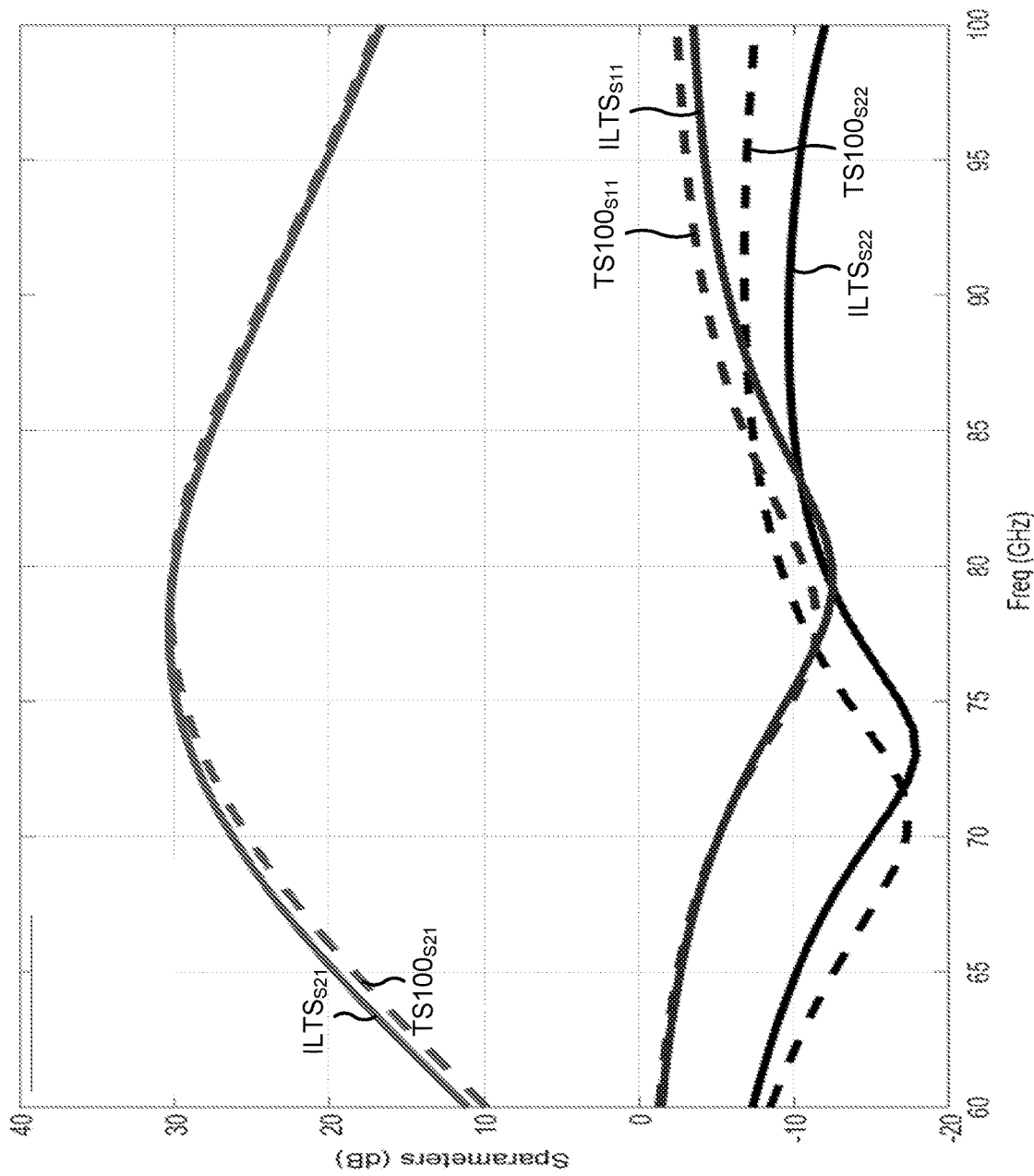

FIG. 3I illustrates an impact on scattering parameters a power amplifier that uses the third example implementation of transformer structure 100. In FIG. 3I, scattering parameters S21, S11, and S22 of the power amplifier that uses the third example implementation of transformer structure 100 are dashed lines labeled with "TS100," while scattering parameters S21, S11, and S22 of a power amplifier that uses the conventional combiner transformer structure are solid lines labeled with "ILTS." As shown in FIG. 3I, in the scattering parameters of the power amplifier that uses the third example implementation of transformer structure 100 do not differ significantly from the scattering parameters of the power amplifier that uses the conventional combiner transformer structure.

Figure 3J:
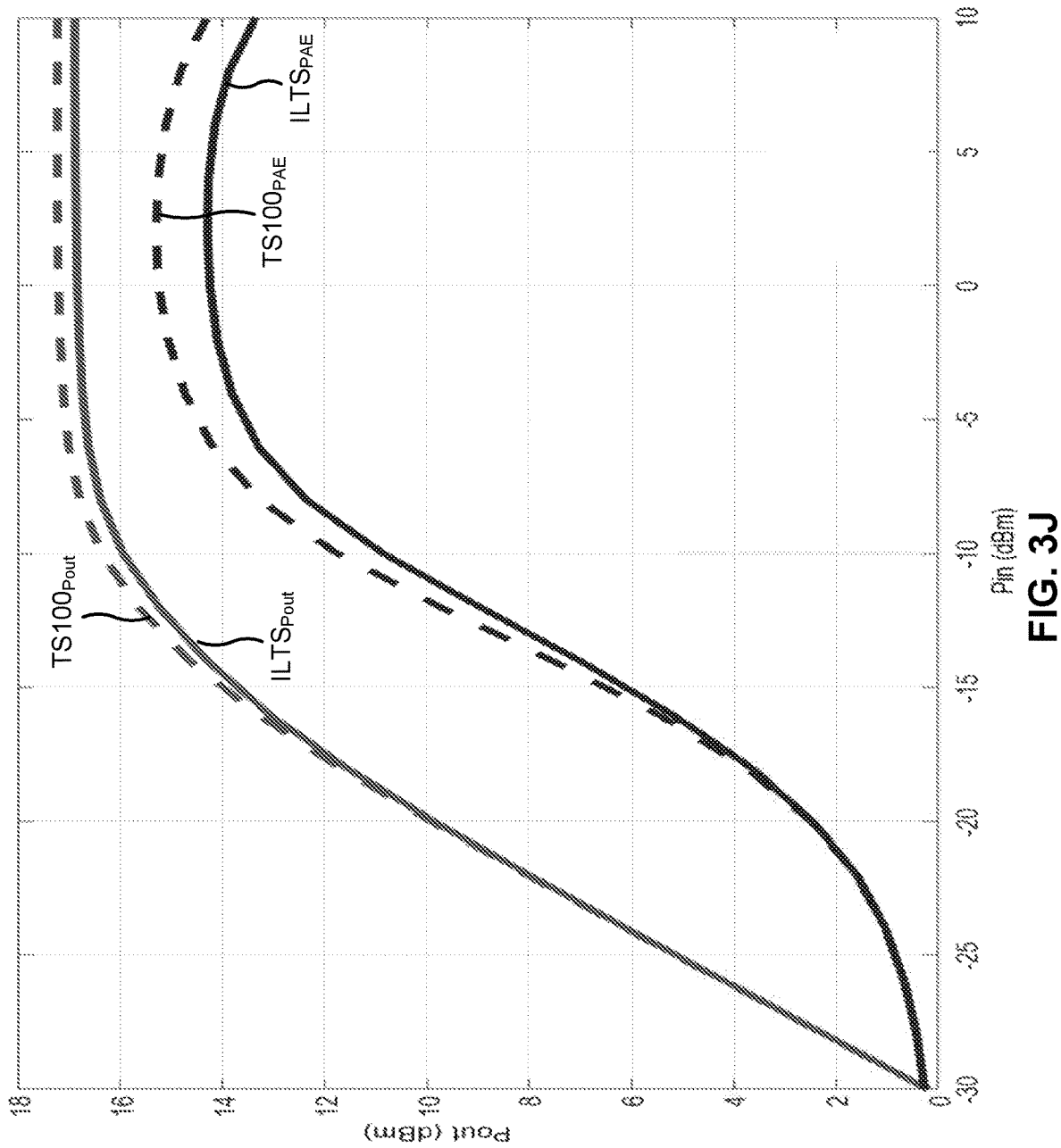

FIG. 3J illustrates an improvement in output power and power-added efficiency (PAE) of a power amplifier that uses the third example implementation of transformer structure 100. In FIG. 3J, the output power of the power amplifier that uses the third example implementation of transformer structure 100 is identified as "$TS100_{Pout}$," the PAE of the power amplifier that uses the third example implementation of transformer structure 100 is identified as "$TS100_{PAE}$," the output power of a power amplifier that uses the conventional combiner transformer structure is identified as "$ILTS_{Pout}$," and the PAE of the power amplifier that uses the conventional combiner transformer structure is identified as "$ILTS_{SAE}$." As shown in FIG. 3J, in the power amplifier that uses the third example implementation of the transformer structure 100, both the output power and the PAE are higher than those of the power amplifier that uses the conventional combiner transformer structure. Thus, without changing the frequency centering of the power amplifier (as illustrated by the scattering parameters in FIG. 3I) both output power and PAE are improved in the power amplifier that uses the third example implementation of transformer structure 100 as illustrated in FIG. 3J).

As indicated above, FIGS. 3A-3J are provided as examples. Other examples may differ from what is described with regard to FIGS. 3A-3J. The number and arrangement of coils, turns, and layers shown in FIGS. 3A-3J are provided as an example. In practice, there may be additional turns, additional layers, fewer turns, fewer layers, different coils, different turns, different layers, differently shaped coils, differently shaped turns, differently shaped layers, differently arranged coils, differently arranged turns, or differently arranged layers than those shown in FIGS. 3A-3J. Further, the dimensions of coils, turns, and layers shown in FIGS. 3A-3J are provided as an example. In practice, the coils, turns, and/or layers may have different dimensions or different relative dimensions than those shown in FIGS. 3A-3J.

Figure 4:
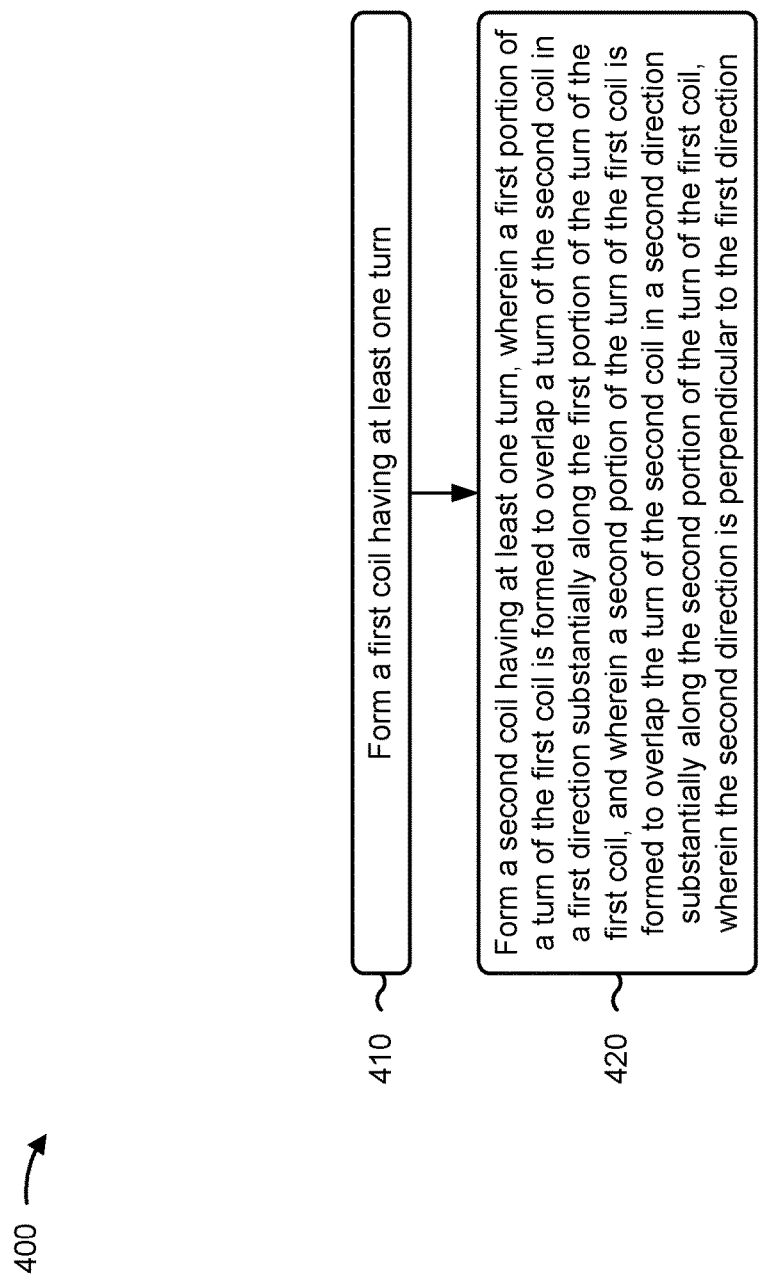
FIG. 4 a flow chart of an example process for providing a transformer structure having a stacked and interleaved architecture, as described herein.

FIG. 4 is a flow chart of an example process 400 for providing a stacked/interleaved transformer structure, as described herein.

As shown in FIG. 4, process 400 may include forming a first coil having at least one turn (block 410). For example, a first coil having at least one turn may be formed, as described above.

As further shown in FIG. 4, process 400 may include forming a second coil having at least one turn, where a first portion of a turn of the first coil is formed to overlap a turn of the second coil in a first direction substantially along the first portion of the turn of the first coil, and a second portion of the turn of the first coil is formed to overlap the turn of the second coil in a second direction substantially along the second portion of the turn of the first coil (block 420). For example, a second coil having at least one turn may be formed, as described above. In some implementations, a first portion of a turn of the first coil is formed to overlap a turn of the second coil in a first direction substantially along the first portion of the turn of the first coil. In some implementations, a second portion of the turn of the first coil is formed to overlap the turn of the second coil in a second direction substantially along the second portion of the turn of the first coil. In some implementations, the second direction is perpendicular to the first direction.

Process 400 may include additional implementations, such as any single implementation or any combination of implementations described below and/or in connection with one or more other processes described elsewhere herein.

In a first implementation, the first coil and the second coil are integrated in a semiconductor device.

In a second implementation, alone or in combination with the first implementation, the first portion of the turn of the first coil is formed to overlap the turn of the second coil in the first direction along at least a quarter of the turn of the first coil and the second portion of the turn of the first coil is formed to overlap the turn of the second coil in the second direction along the at least the quarter of the turn of the first coil.

In a third implementation, alone or in combination with one or more of the first and second implementations, the first coil is a primary coil of a transformer structure and the second coil is a secondary coil of the transformer structure.

In a fourth implementation, alone or in combination with one or more of the first through third implementations, the first coil is a secondary coil of a transformer structure and the second coil is a primary coil of the transformer structure.

In a fifth implementation, alone or in combination with one or more of the first through fourth implementations, the first portion of the turn of the first coil is formed from a first metal layer of a metal stack and the second portion of the turn of the first coil is formed from a second metal layer of the metal stack, the first portion of the turn of the first coil being connected to the second portion of the turn of the first coil substantially along the turn of the first coil.

In a sixth implementation, alone or in combination with one or more of the first through fifth implementations, the second coil is formed from the first metal layer.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

The foregoing disclosure provides illustration and description, but is not intended to be exhaustive or to limit the implementations to the precise form disclosed. Modifications and variations may be made in light of the above disclosure or may be acquired from practice of the implementations.

As used herein, the term "component" is intended to be broadly construed as hardware, firmware, and/or a combination of hardware and software.

It will be apparent that systems and/or methods described herein may be implemented in different forms of hardware, firmware, or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A transformer structure, comprising:
a first coil having one or more turns; and
a second coil having one or more turns,
wherein a turn of the one or more turns of the first coil overlaps a turn of the one or more turns of the second coil in a lateral direction substantially along the turn of the first coil and in a vertical direction substantially along the turn of the first coil,
wherein the turn of the first coil overlaps the turn of the second coil in the lateral direction of a same portion of the turn of the second coil as the vertical direction such that a particular portion of the first coil extends outward beneath the second coil.

2. The transformer structure of claim 1, wherein the transformer structure is integrated in a semiconductor device.

3. The transformer structure of claim 1, wherein the turn of the first coil overlaps the turn of the second coil in the lateral direction and in the vertical direction along more than a quarter of the turn of the first coil.

4. The transformer structure of claim 1, wherein the first coil is a primary coil of the transformer structure and the second coil is a secondary coil of the transformer structure.

5. The transformer structure of claim 1, wherein the first coil is a secondary coil of the transformer structure and the second coil is a primary coil of the transformer structure.

6. The transformer structure of claim 1, wherein a first portion of the turn of the first coil is formed from a first metal layer of a metal stack and a second portion of the turn of the first coil is formed from a second metal layer of the metal stack, the first portion of the turn of the first coil being connected to the second portion of the turn of the first coil substantially along the turn of the first coil.

7. The transformer structure of claim 6, wherein the first portion of the turn of the first coil overlaps the turn of the second coil in the lateral direction and the second portion of the turn of the first coil overlaps the turn of the second coil in the vertical direction.

8. The transformer structure of claim 6, wherein the second coil is formed from the first metal layer.

9. The transformer structure of claim 6, wherein the first metal layer is connected to the second metal layer substantially along the turn of the first coil through a via structure between the first metal layer and the second metal layer.

10. A method, comprising:
forming a first coil having at least one turn; and
forming a second coil having at least one turn,
wherein a first portion of a turn of the first coil is formed to overlap a turn of the second coil in a first direction substantially along the first portion of the turn of the first coil, and
wherein a second portion of the turn of the first coil is formed to overlap the turn of the second coil in a second direction substantially along the second portion of the turn of the first coil,
wherein the second direction is perpendicular to the first direction,
wherein the turn of the first coil overlaps the turn of the second coil in the first direction of a same portion of the turn of the second coil as the second direction, and
wherein a particular portion of the first coil extends outward beneath the second coil.

11. The method of claim 10, wherein the first coil and the second coil are integrated in a semiconductor device.

12. The method of claim 10, wherein the first portion of the turn of the first coil is formed to overlap the turn of the second coil in the first direction along at least a quarter of the turn of the first coil and the second portion of the turn of the first coil is formed to overlap the turn of the second coil in the second direction along the at least the quarter of the turn of the first coil.

13. The method of claim 10, wherein the first coil is a primary coil of a transformer structure and the second coil is a secondary coil of the transformer structure.

14. The method of claim 10, wherein the first coil is a secondary coil of a transformer structure and the second coil is a primary coil of the transformer structure.

15. The method of claim 10, wherein the first portion of the turn of the first coil is formed from a first metal layer of a metal stack and the second portion of the turn of the first coil is formed from a second metal layer of the metal stack, the first portion of the turn of the first coil being connected to the second portion of the turn of the first coil substantially along the turn of the first coil.

16. The method of claim 15, wherein the second coil is formed from the first metal layer.

17. A semiconductor device comprising:
a transformer structure, including:
a first coil having one or more turns; and
a second coil having one or more turns,
wherein a turn of the one or more turns of the first coil overlaps a turn of the one or more turns of the second coil in a lateral direction and in a vertical direction substantially along the turn of the first coil,
wherein the turn of the first coil overlaps the turn of the second coil in the lateral direction of a same portion of the turn of the second coil as the vertical direction, and
wherein a particular portion of the first coil extends outward beneath the second coil.

18. The semiconductor device of claim 17, wherein the turn of the first coil overlaps the turn of the second coil in the lateral direction and in the vertical direction along at least a quarter of the turn of the first coil.

19. The semiconductor device of claim 17, wherein the first coil is a primary coil of the transformer structure and the second coil is a secondary coil of the transformer structure.

20. The semiconductor device of claim 17, wherein a first portion of the turn of the first coil is formed from a first metal layer of a metal stack, a second portion of the turn of the first coil is formed from a second metal layer of the metal stack, and the second coil is formed from the first metal layer substantially along the turn of the first coil.

* * * * *